US012793762B2

(12) United States Patent
Lee et al.

(10) Patent No.: US 12,793,762 B2
(45) Date of Patent: Nov. 10, 2026

(54) ADAPTIVE REFRESH STAGGERING

(71) Applicant: Micron Technology, Inc., Boise, ID (US)

(72) Inventors: Hyun Yoo Lee, Boise, ID (US); Smruti Subhash Jhaveri, Boise, ID (US); Kang-Yong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 188 days.

(21) Appl. No.: 18/511,404

(22) Filed: Nov. 16, 2023

(65) Prior Publication Data

US 2024/0170038 A1 May 23, 2024

Related U.S. Application Data

(60) Provisional application No. 63/384,277, filed on Nov. 18, 2022.

(51) Int. Cl.
*G11C 11/406* (2006.01)

(52) U.S. Cl.
CPC .. *G11C 11/40618* (2013.01); *G11C 11/40615* (2013.01)

(58) Field of Classification Search
CPC ................................................ G11C 11/40618
See application file for complete search history.

(56) References Cited

U.S. PATENT DOCUMENTS

| | | | | |
|---|---|---|---|---|
| 10,241,687 | B2 * | 3/2019 | Yang | G06F 12/023 |
| 2021/0074348 | A1 * | 3/2021 | Prather | G11C 7/1072 |
| 2022/0374168 | A1 * | 11/2022 | Ayyapureddi | G06F 3/0611 |

* cited by examiner

*Primary Examiner* — Hoai V Ho
(74) *Attorney, Agent, or Firm* — Colby Nipper PLLC

(57) ABSTRACT

Described apparatuses and methods relate to adaptive refresh staggering for a memory system that may support a nondeterministic protocol. To help manage power-delivery networks in a memory system, a memory device can include logic that can be programmed to stagger the start of refresh operations for each die upon receiving a command to enter a lower-power mode, such as self-refresh. The staggered start can be implemented at a channel level, a package level, or both. The programming sets a delay for each die so that initiation of refresh operations is staggered. Thus, a first die can initiate refresh operations when a command to enter the lower-power mode is received (e.g., approximately zero delay). However, initiation of refresh operations for subsequent dies (e.g., "after" the first die) is delayed, which can reduce peak current draw and power consumption.

20 Claims, 12 Drawing Sheets

800

ADAPTIVE REFRESH STAGGERING

CROSS-REFERENCE TO RELATED APPLICATION(S)

This application claims priority to U.S. Provisional Patent Application Ser. No. 63/384,277 filed on Nov. 18, 2022, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and nonvolatile memory (e.g., flash memory). Like the number of cores or speed of a processor, the rate at which data can be accessed, as well as the delays in accessing it, can impact an electronic device's performance. This impact on performance increases as processors are developed that execute code faster and as applications on electronic devices operate on ever-larger data sets that require ever-larger memories.

BRIEF DESCRIPTION OF THE DRAWINGS

Apparatuses of and techniques for adaptive refresh staggering are described with reference to the following drawings. The same numbers are used throughout the drawings to reference like features and components:

FIG. 5-1 illustrates a portion of an example memory system that can implement aspects of adaptive refresh staggering;

FIG. 5-2 illustrates example timing and signaling operations that can be used with logic circuitry to implement aspects of adaptive refresh staggering with a memory device;

FIG. 6-1 illustrates a portion of another example memory system that can implement aspects of adaptive refresh staggering;

FIG. 6-2 illustrates example timing and signaling operations that can be used with logic circuitry to implement other aspects of adaptive refresh staggering with a memory device;

DETAILED DESCRIPTION

Overview

Figure 1:
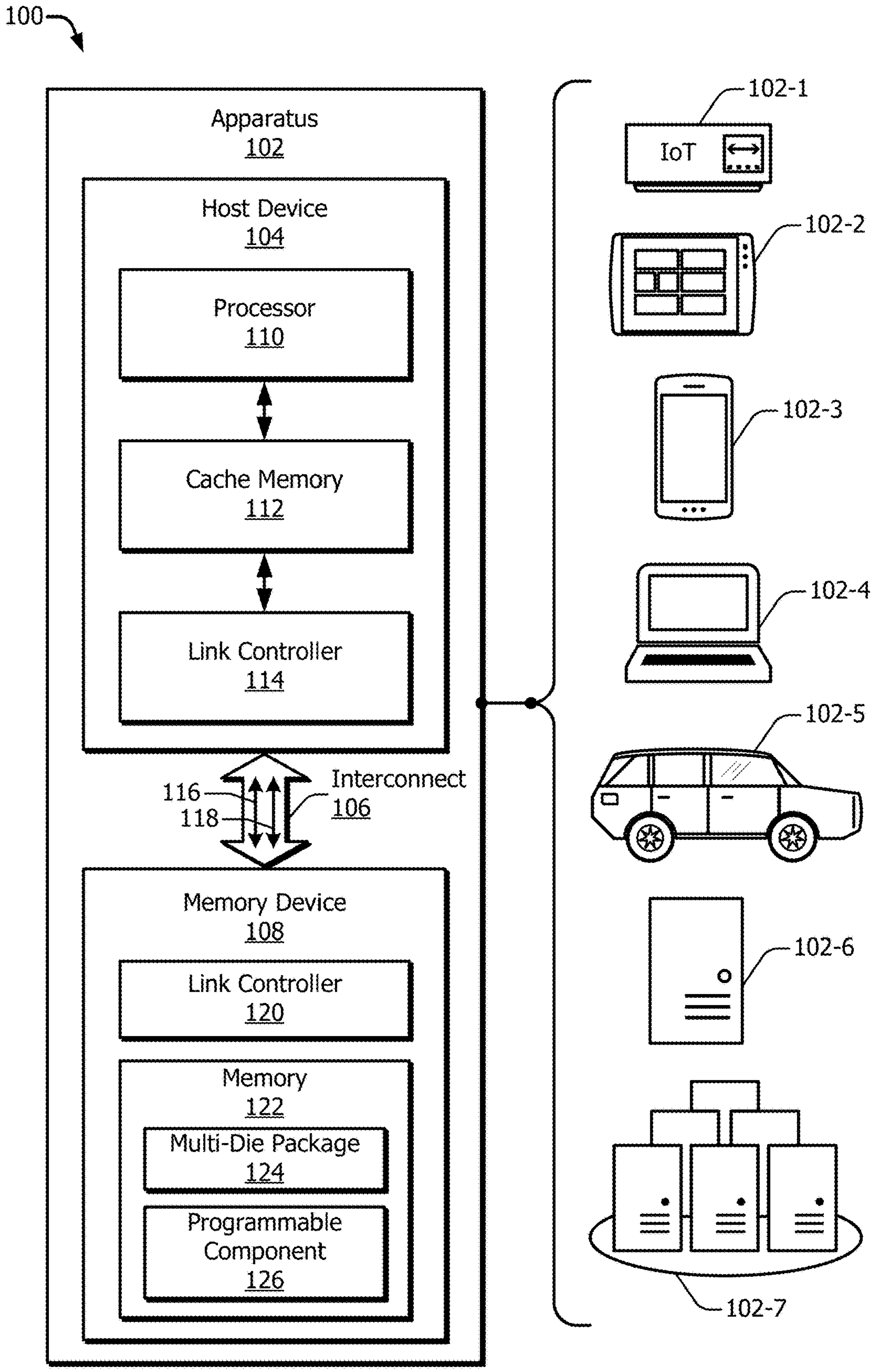
FIG. 1 illustrates example apparatuses that can implement aspects of adaptive refresh staggering.

Processors and memory work in tandem to provide features on computers and other electronic devices, including smartphones. An electronic device can generally provide enhanced features, such as high-resolution graphics and artificial intelligence, as a processor-and-memory tandem operates faster. Some applications, such as those for artificial intelligence and virtual-reality graphics, demand increasing amounts of memory. Advances in processors have often outpaced those for memories or connections between a processor and a memory.

Processors and memories can be secured to a printed circuit board (PCB), such as a motherboard. The PCB can include sockets for accepting at least one processor and one or more memories and various wiring infrastructure that enable communication between two or more components. The PCB, however, offers a finite area for the sockets and the wiring infrastructure. Some PCBs include sockets that are shaped into linear slots and are designed to accept multiple double-inline memory modules (DIMMs). These sockets can be fully occupied by DIMMs while a processor is still able to utilize more memory. In such situations, the system can have improved performance if more memory were available.

Printed circuit boards may also include at least one peripheral component interconnect (PCI) express (PCI Express®) (PCIe) slot. PCIe is designed to provide a common interface for various types of components that may be coupled to a PCB. Compared to some older standards, PCIe can provide higher rates of data transfer or a smaller footprint on the PCB, including both greater speed and smaller size. PCIe links enable interconnection of processors and peripheral memory devices at increased speeds compared to older standards. Accordingly, some PCBs enable a processor to access a memory device that is connected to the PCB via a PCIe slot.

PCIe links, however, have limitations in an environment with large, shared memory pools and devices that require high bandwidth and low latency. For example, PCIe links do not specify mechanisms to support coherency and often cannot efficiently manage isolated pools of memory. In addition, the latency for PCIe links can be too high to efficiently manage shared memory access across multiple devices within a system.

As a result, accessing a memory solely using a PCIe protocol may not offer as much functionality, flexibility, or reliability as is desired. In such cases, another protocol can be layered on top of the PCIe protocol. An example of another, higher-level protocol is the Compute Express Link (CXL) protocol or standard (referred to hereinafter as "the CXL protocol" or "the CXL standard"). The CXL protocol can be implemented over a physical layer that is governed by, for instance, the PCIe protocol. The CXL protocol targets intensive workloads for processors and memory devices (e.g., accelerators, memory expanders), where efficient, coherent memory access or interactions between processors and memory is beneficial. The CXL protocol addresses some of the limitations of PCIe links by providing an interface that leverages the PCIe 5.0 physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expenders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing.

Various electronic devices, such as a mobile phone with a system-on-chip (SoC) or a cloud-computing server with dozens of processing units, may employ memory that is coupled to a processor via a CXL-based interconnect (which can be referred to as a "CXL link" in this document). For clarity, consider an apparatus with a host device that is coupled to a memory device via a CXL link. The host device can include a processor and a controller (e.g., a host-side controller) that is coupled to the interconnect. The memory device can include another controller (e.g., a memory-side controller) that is coupled to the interconnect and one or more memory arrays to store information in static RAM (SRAM), dynamic RAM (DRAM), flash memory, and so forth.

While the CXL protocol can help address the issue of the higher latency of PCIe links, using CXL can also lead to challenges related to power consumption when used with some types of memory. For example, volatile memory, including double data rate synchronous dynamic random-access memory (DDR SDRAM) and low-power DDR (LPDDR), is made in part from capacitors, from which the charge slowly drains over time. Data stored in memory cells of volatile memory may be lost if the capacitor is not recharged. Therefore, to maintain an appropriate charge, the memory cells are periodically refreshed.

To perform a refresh operation, the memory reads data from a memory cell corresponding to a refresh address into a temporary storage (e.g., a sense amp) and then writes the data back to the memory cell with the proper charge. A refresh address can include, for example, one or more of memory cell addresses, row addresses, or bank addresses. Refresh operations may be initiated and controlled by a memory controller or other logic that is external to a chip or die including the memory component (e.g., using an auto-refresh command issued by the memory controller) or by logic that is internal to the memory chip or die (e.g., using a self-refresh operation controlled by the logic). A self-refresh operation may further involve deactivating an internal clock to reduce power consumption and executing a refresh operation by using an internal refresh counter.

Generally, each memory cell in a volatile memory is refreshed at least once within a given refresh interval to maintain the integrity of stored data (e.g., a refresh interval of approximately 32 milliseconds or approximately 64 milliseconds). The logic may therefore issue a refresh command that corresponds to or includes one all-bank refresh command (sometimes called, for example, ABR or REFab) or multiple per-bank refresh commands (e.g., PBR or REFpb), depending on the bank configuration. The memory controller can issue the refresh command(s) at a frequency sufficient to refresh each memory cell of a given memory array within the relevant refresh interval. When the memory is in a power-saving mode (e.g., a self-refresh mode), the memory can perform the self-refresh operations at a same or similar rate or frequency, using the internal clock or counter.

Refresh operations can, however, present challenges of their own. For example, refresh operations consume relatively large amounts of power. During a refresh operation, multiple wordlines per bank (and/or per die) can be activated at approximately the same time to refresh an entire memory often enough to maintain performance and data-integrity metrics (e.g., as defined in a specification such as a Joint Electron Device Engineering Council (JEDEC) standard). Activating a wordline refreshes the row served by the wordline and causes a current peak. The larger the page size (e.g., row size), the higher the peak current will be. During a typical refresh for a DRAM component, two or four wordlines per bank are activated at the same time (e.g., per command) with a 1-2 kilobyte (KB) page size. Thus, the total page size is 2-8 KB.

This effect can become more pronounced with volatile memory (e.g., DRAM) for use with CXL devices. The page size may be similar to the higher end of typical memory page sizes (e.g., 2.25 KB), but because of other factors (e.g., higher density, larger die sizes, refresh timing requirements, data-retention requirements), volatile memory used with CXL devices often refreshes more wordlines per bank at one time (e.g., eight or more wordlines at a time). This tendency can bring the total page size closer to 18 KB, which means the peak current can be between nearly three and nine times higher with CXL devices. The higher peak current can make designing a local power delivery network (PDN) more complex and increase the cost of the PDN (e.g., more metal layers, capacitors).

Further, for multi-channel DRAM memory (CXL or otherwise), self-refresh (and refresh) operations for each DRAM channel can be independent from the other channel(s). Refresh or self-refresh operations for multiple channels may thus occur simultaneously or nearly simultaneously, which may cause a spike in noise from combined peak refresh power consumption. This spike can also occur in multi-die packages that support one channel or multiple channels. When a refresh (or self-refresh) signal is received, multiple wordlines in multiple dies may be activated. And, if the package supports multiple channels, this activation can happen independently (e.g., at nearly the same time) for multiple channels in the package.

Increased current draw can also increase electrical noise (e.g., power noise), which can have an adverse impact on memory performance. For example, higher levels of noise during a training mode or period (e.g., as described in a JEDEC standard, including but not limited to multiple modes of command bus training, data (DQ) bus training, CA/DQ VREF training, duty-cycle monitor training, Read_DQ calibration training, and/or WCK-DQ training) can reduce the effectiveness and/or accuracy of a training procedure, which can adversely affect the performance and integrity of the memory device or system.

To improve performance of a memory system, including, for example, a CXL system, this document describes example approaches that can be used to implement adaptive refresh staggering. Consider an example system in which dies of a multi-die package can be programmed with a delay value to stagger the start of refresh operations for each die upon receiving a command to enter a self-refresh mode. The stagger can be implemented at a channel level, a package level, or both. The programming inserts a delay between each die so that the initiation of refresh operations is staggered. Thus, a first die can initiate refresh operations when the command to enter the self-refresh mode is received. However, the initiation of refresh operations for a second die (e.g., "after" the first die) is delayed, reducing peak current draw. Additional dies can be delayed by a similar or different amount of time, thereby staggering the start of refresh operations and reducing the peak current draw and power consumption.

By employing one or more of these implementations, peak power consumption (e.g., peak current draw) at the channel and/or package level can be reduced. Because training accuracy can be adversely affected by power noise, implementing aspects of adaptive refresh staggering to reduce power noise can improve memory performance by increasing training accuracy. Peak power reduction can also reduce requirements for metal layers and other components in the local PDN, which can reduce costs. Reducing the peak current at the channel and/or package level can also reduce the system-level peak current, making system-level PDN design less complex. Additionally, adaptive refresh staggering can reduce costs for a power-management integrated circuit (PMIC) by reducing peak power demands for the system.

While staggering the initiation of refresh operations between dies or channels can reduce peak currents, a number of wordlines refreshed during a particular self-refresh mode duration may be reduced because the stagger adds time between refresh operations. This may increase latency because more overall refresh operations may be needed to maintain data integrity. Reducing power consumption, however, allows memory designers and engineers to make design tradeoffs between PDN parameters or limitations and overall memory performance (e.g., training accuracy and latency), which can enable solutions for different customers and product-design parameters.

Example Operating Environments

FIG. 1 illustrates, at 100 generally, an example apparatus 102 that can implement aspects of adaptive refresh staggering. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure or a data center or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a link controller 114. The memory device 108, which can be also be a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device, such as a flash memory, hard disk drive, a computational storage device (e.g., a computational storage device (CSx), a computational storage processor (CSP), a computational storage drive (CSD), or a computational storage array (CSA)), a solid-state drive, phase-change memory (PCM), or memory employing 3D XPoint™).

The processor 110 is operatively coupled to the cache memory 112, which is operatively coupled to the link controller 114. The processor 110 is also coupled, directly or indirectly, to the link controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the link controller 114 can provide a high-level or logical interface between the processor 110 and at least one memory (e.g., an external memory). The link controller 114 can, for example, receive memory requests from the processor 110 and provide the memory requests to external memory with appropriate formatting, timing, and reordering. The link controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

The interconnect 106 can include at least one command and address bus 116 (CA bus 116) and at least one data bus 118 (DQ bus 118). Each bus may be a unidirectional or a bidirectional bus. The CA bus 116 and the DQ bus 118 may couple to CA and DQ pins, respectively, of the memory device 108. In some implementations, the interconnect 106 may also include a chip-select (CS) I/O (not illustrated in FIG. 1) that can, for example, couple to one or more CS pins of the memory device 108. The interconnect 106 may also include a clock bus (CK bus—not illustrated in FIG. 1) that is part of or separate from the CA bus 116.

The interconnect 106 can be a CXL link. In other words, the interconnect 106 can comport with at least one CXL standard or protocol. The CXL link can provide an interface on top of the physical layer and electricals of the PCIe 5.0 physical layer. The CXL link can cause requests to and responses from the memory device 108 to be packaged as flits. An example implementation of the apparatus 102 with a CXL link is discussed in greater detail with respect to FIG. 4. In other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the link controller 114. A memory (e.g., the memory device 108) may have an "internal" or "local" cache memory. As another example, the apparatus 102 may include cache memory between the interconnect 106 and the memory device 108. Computer engineers can also include the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated on an IC or fabricated on separate Ics packaged together. The memory device 108 may also be coupled to multiple host devices 104 via one or more interconnects 106 and may respond to memory requests from two or more host devices 104. Each host device 104 may include a respective link controller 114, or the multiple host devices 104 may share a link controller 114. This document describes an example computing system architecture with at least one host device 104 coupled to the memory device 108 with reference to FIG. 2.

Two or more memory components (e.g., modules, dies, banks, bank groups, or ranks) can share the electrical paths or couplings of the interconnect 106. In some implementations, the CA bus 116 transmits addresses and commands from the link controller 114 to the memory device 108, which may exclude propagating data. The DQ bus 118 can propagate data between the link controller 114 and the memory device 108. The memory device 108 can also include a link controller 120 that is similar to the link controller 114 of the host device 104. The link controllers 114 and 120 can, for example, package and unpackage requests and responses in the appropriate format (e.g., as a flit) for transmission over the interconnect 106. The memory device 108 includes memory 122, which may include multiple memory blocks, arrays, dies and/or banks (not illustrated in FIG. 1). The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, the memory device 108 can include a multi-die package 124 (package 124) that can implement aspects of adaptive refresh staggering. For example, the package 124 can be incorporated at the memory 122 or at another functional position between the interconnect 106 and the memory 122. In some implementations, multiple dies of the package 124 can be programmed to delay or stagger initiation of refresh operations (e.g., in a self-refresh mode) for the multiple dies to reduce peak power draw during the refresh operations, as described in more detail with reference to FIG. 2 through FIG. 10.

For example, the memory device 108 can include or have access to one or more programmable components 126 that can indicate, for each of the multiple dies of the package 124, a time delay duration. The programmable components can be any of a variety of components that can store values or data (e.g., bits). For example, the programmable components 126 can be fuse-based (e.g., fuses and/or anti-fuses) or register-based (e.g., mode registers or other memory registers, latches, or another type of register). The multiple dies can be individually identified using any suitable identification, including a fuse-based identification (e.g., a fuse-ID) or an impedance-based identification (e.g., using a ZQ pin or ball, a ZQ master designation, and so forth). The dies of the multi-die package 124 can include logic (not shown in FIG. 1) that can read or otherwise access the programmable components 126 to determine the duration of any time delay associated with the dies. The duration of the delay, if any, may be different for each die. The delay may be programmed by a manufacturer (e.g., a memory fabricator) or a customer (e.g., a customer using the memory in another system or device).

Figure 2:
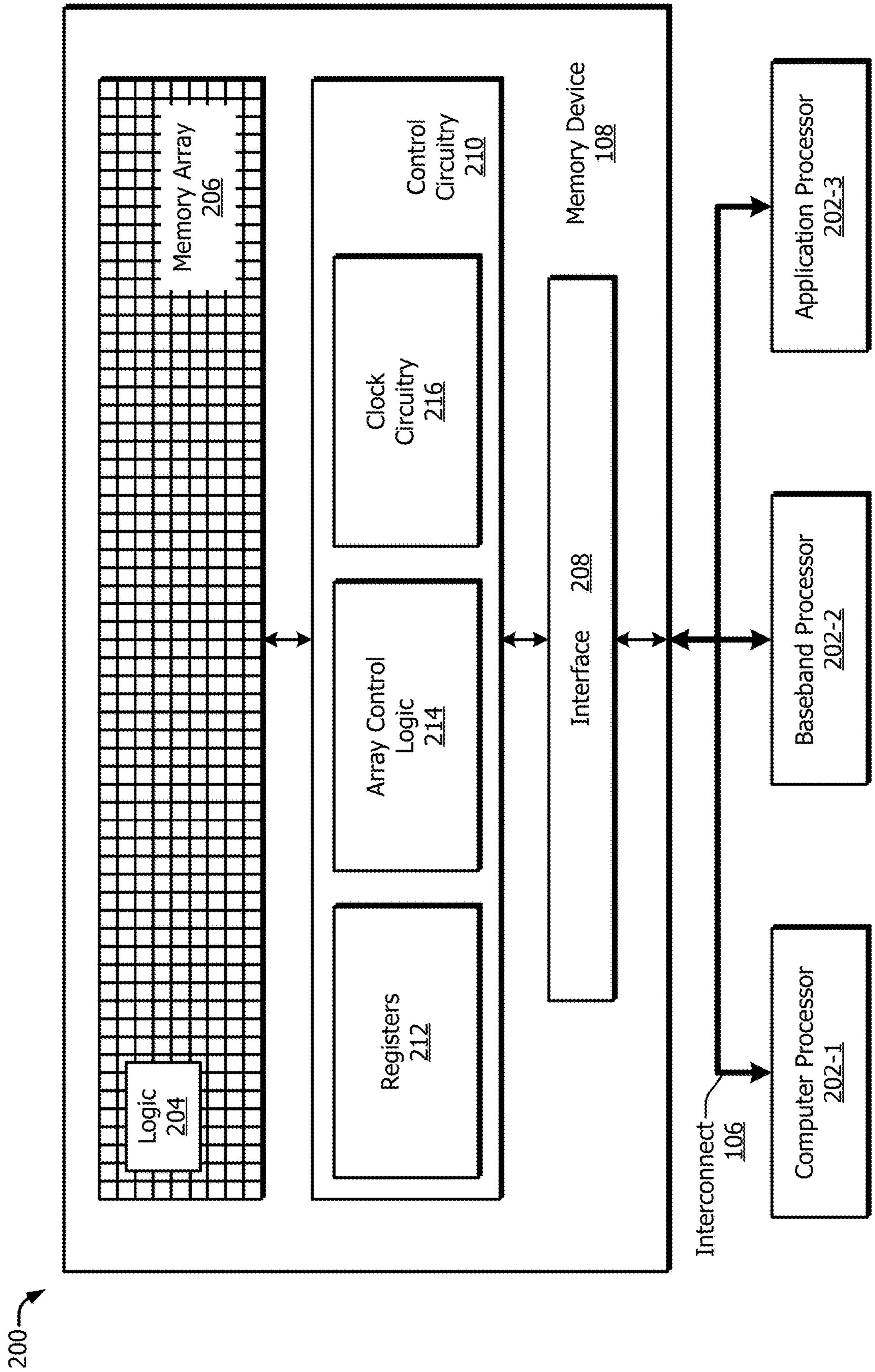
FIG. 2 illustrates an example computing system that can implement aspects of adaptive refresh staggering with a memory device.

FIG. 2 illustrates an example computing system 200 that can implement aspects of adaptive refresh staggering with a memory device. In some implementations, the computing system 200 includes at least one memory device 108, at least one interconnect 106, and at least one processor 202. In the illustrated implementation, the memory device 108 also includes at least one logic circuit 204 (also referred to as logic 204).

The memory device 108 can include, or be associated with, at least one memory array 206, at least one interface 208, and control circuitry 210 operatively coupled to the memory array 206. The memory device 108 can correspond, for example, to the memory 122 of the apparatus 102 of FIG. 1. Thus, the memory array 206 can include one or more dies or arrays of memory cells, including but not limited to memory cells of DRAM, SDRAM, 3D-stacked DRAM, DDR memory, low-power DRAM, or LPDDR SDRAM. For example, the memory array 206 can include memory cells of SDRAM configured as a memory module with one channel containing either 16 or 8 data (DQ) signals, double-data-rate input/output (I/O) signaling, and supporting a supply voltage of 0.3 to 0.5V. In other implementations, the memory module may be configured to support multiple channels. The density of the memory device 108 can range, for instance, from 2 Gb to 32 Gb. The memory array 206 and the control circuitry 210 may be components on a single semiconductor die or on separate semiconductor dies. The memory array 206 or the control circuitry 210 may also be distributed or repeated across multiple dies.

The control circuitry 210 can include various components that the memory device 108 can use to perform various operations. These operations can include communicating with other devices, managing memory performance, and performing memory read or write operations. For example, the control circuitry 210 can include one or more registers 212, at least one instance of array control logic 214, and clock circuitry 216. The registers 212 may be implemented, for example, as one or more registers (e.g., a masked-write enablement register) that can store information to be used by the control circuitry 210 or another part of the memory device 108. The array control logic 214 can be circuitry that provides command decoding, address decoding, input/output functions, amplification circuitry, power supply management, power control modes, and other functions. The clock circuitry 216 can synchronize various memory components with one or more external clock signals provided over the interconnect 106, including a command/address clock or a data clock. The clock circuitry 216 can also use an internal clock signal to synchronize memory components.

In the illustrated implementation, the logic circuit 204 is included in or at the memory array 206. In other implementations, the logic circuit 204 may be incorporated in or at another component of the memory device 108, such as the control circuitry 210. As described with respect to the package 124, the logic 204 can be used to read or otherwise access stored data that indicates a time delay for staggering initiation of refresh or self-refresh operations, as described above. For example, the logic circuit 204 can read or otherwise access the programmable components 126 (not shown in FIG. 2) to determine a duration of any time delay associated with a die to reduce peak power draw during refresh operations, as described in more detail with reference to FIGS. 2-10. While this delay may slightly increase system latency, it can reduce peak power draw during refresh or self-refresh operations. Reducing power consumption allows memory designers and engineers to make tradeoffs between training accuracy, power distribution network limitations, and overall memory latency, which can enable solutions for different customers and product-design parameters.

The interface 208 can couple the control circuitry 210 or the memory array 206 directly or indirectly to the interconnect 106. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be separate components on a single semiconductor die or across multiple semiconductor dies. These components may individually or jointly couple to the interconnect 106 via the interface 208.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 116 and a DQ bus 118 (as illustrated in FIG. 1). As discussed above with respect to FIG. 1, the interconnect 106 can be a CXL link or comport with at least one CXL standard. The CXL link can provide an interface on top of the physical layer and electricals of the PCIe 5.0 physical layer.

In some aspects, the memory device 108 may be a "separate" component relative to the host device 104 (of FIG. 1) or any of the processors 202. The separate components can include a PCB, memory card, memory stick, and memory module (e.g., a multi-die (n-DP) package, a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a PCB or in a single package or an SoC.

The designed apparatuses and methods may be appropriate for memory designed for lower-power operations or energy-efficient applications. An example of a memory standard related to low-power applications is the LPDDR standard for SDRAM as promulgated by the JEDEC Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a standard.

As shown in FIG. 2, the processors 202 may include a computer processor 202-1, a baseband processor 202-2, and an application processor 202-3, coupled to the memory device 108 through the interconnect 106. The processors 202 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized similar to the processor 110 of FIG. 1. Accordingly, a respective processor 202 can include or be associated with a respective link controller, like the link controller 114 illustrated in FIG. 1. Alternatively, two or more processors 202 may access the memory device 108 using a shared link controller 114.

Example Techniques and Hardware

Figure 3:
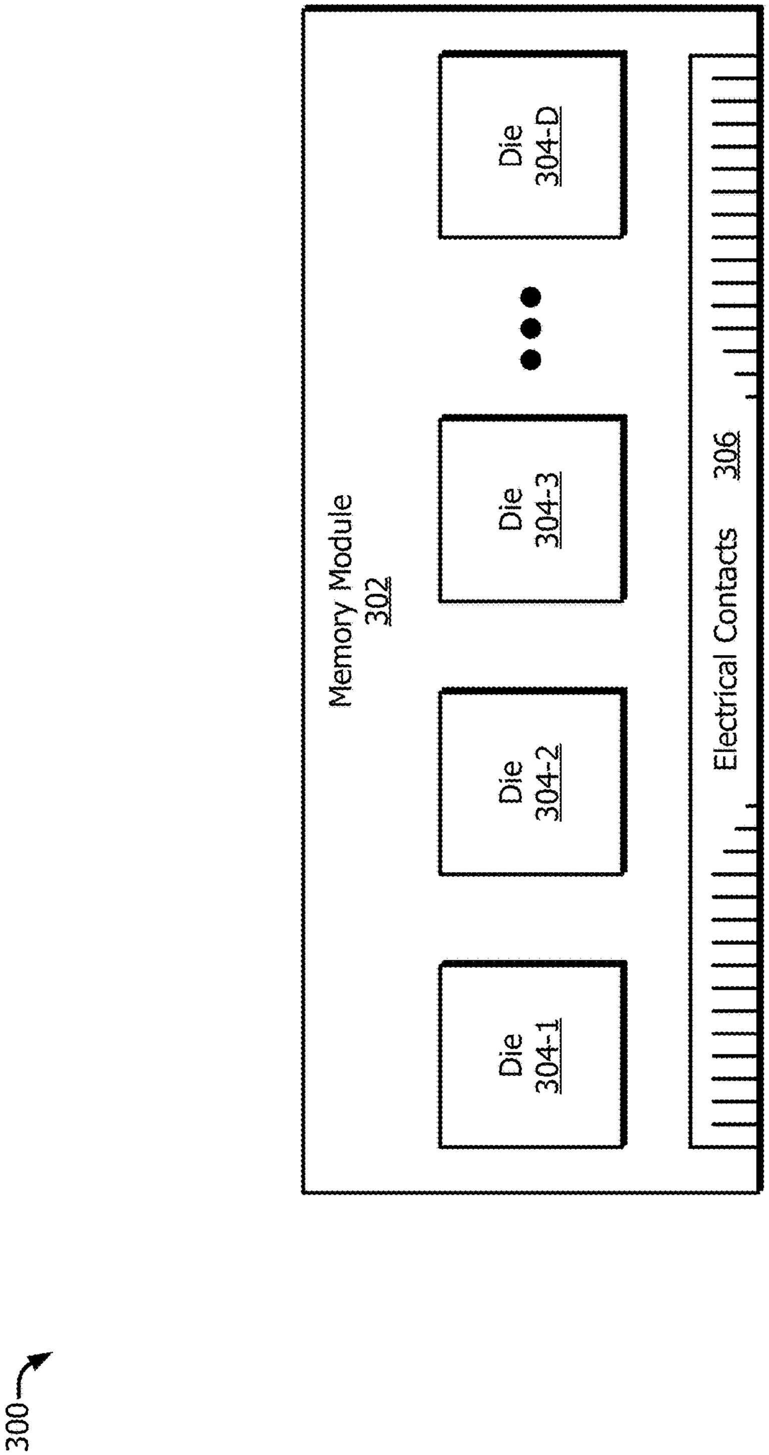
FIG. 3 illustrates an example memory device.

FIG. 3 illustrates an example memory device 300. An example memory module 302 includes multiple dies 304. As illustrated, the memory module 302 includes a first die 304-1, a second die 304-2, a third die 304-3, and a D$^{th}$ die 304-D, with "D" representing a positive integer. As a few examples, the memory module 302 can be a multi-die (n-DP) package, a SIMM or a DIMM. As another example, the memory module 302 can interface with other components via a bus interconnect (e.g., a Peripheral Component Interconnect Express (PCIe) bus). The memory device 108 illustrated in FIGS. 1 and 2 can correspond, for example, to a single die 304, multiple dies 304-1 through 304-D, or a memory module 302 with at least one die 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or unique in size, shape, data capacity, or control circuitries. The dies 304 may also be positioned on a single side or on multiple sides of the memory module 302. In some cases, the memory module 302 may be part of a CXL memory system or module. Additionally or alternatively, the memory module 302 may include or be a part of another memory device, such as the memory device 108.

Figure 4:
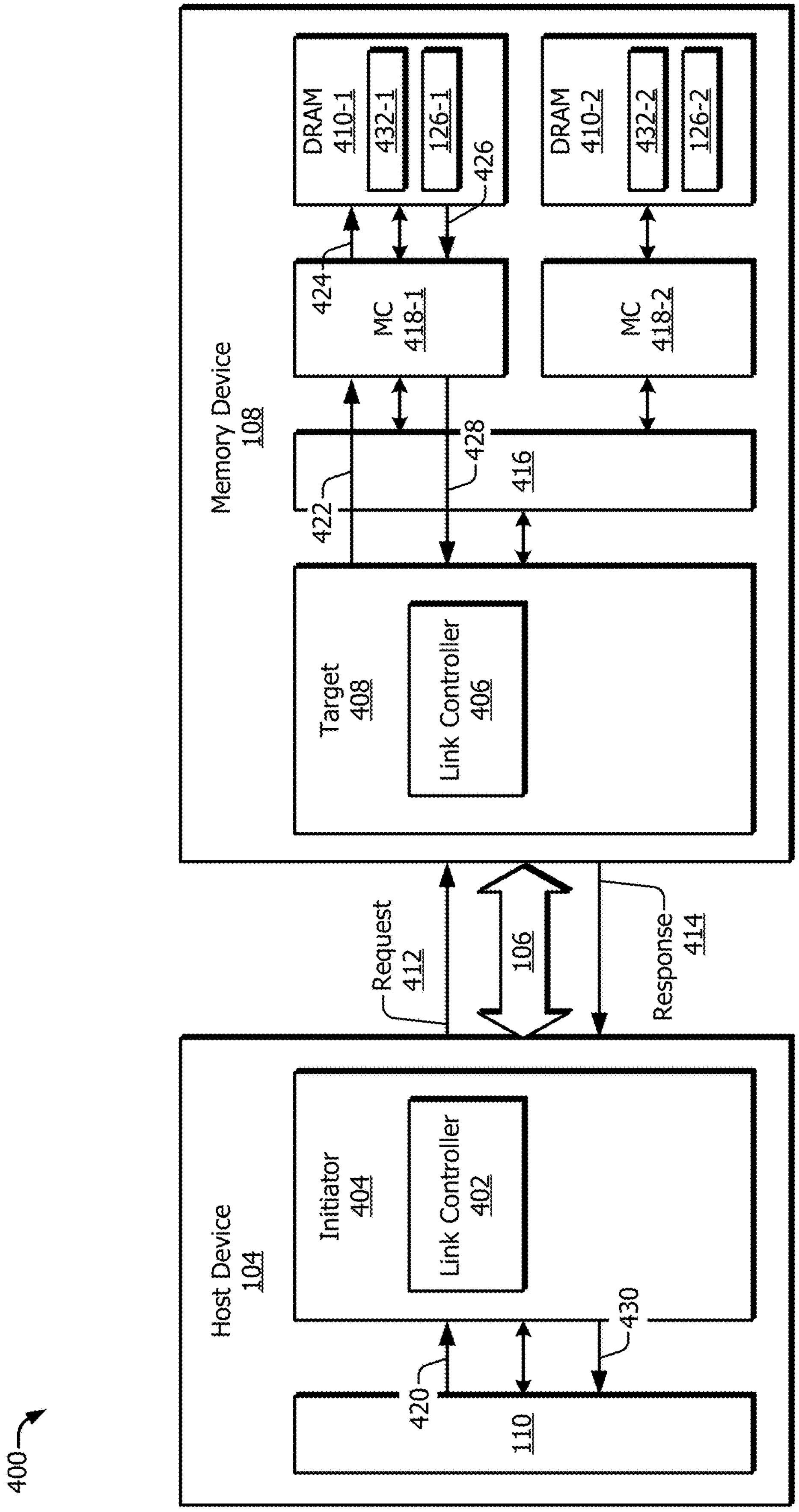
FIG. 4 illustrates an example of a system that includes a host device and a memory device coupled together via an interconnect.

FIG. 4 illustrates an example of a system 400 that includes a host device 104 and a memory device 108 that are coupled together via an interconnect 106. The system 400 may form at least part of an apparatus 102 as shown in FIG. 1. As illustrated, the host device 104 includes a processor 110 and a link controller 402, which can be realized with at least one initiator 404. Thus, the initiator 404 can be coupled to the processor 110 or to the interconnect 106 (including to both), and the initiator 404 can be coupled between the processor 110 and the interconnect 106. Examples of initiators 404 may include a leader, a primary, a master, a main component, and so forth.

In the illustrated example system 400, the memory device 108 includes a link controller 406, which may be realized with at least one target 408. The target 408 can be coupled to the interconnect 106. Thus, the target 408 and the initiator 404 can be coupled to each other via the interconnect 106. Examples of targets 408 may include a follower, a secondary, a slave, a responding component, and so forth. The memory device 108 also includes a memory (e.g., the memory 122 of FIG. 1), which may be realized with at least one memory module or other component, such as a DRAM 410, as is described further below.

In example implementations, the initiator 404 includes the link controller 402, and the target 408 includes the link controller 406. The link controller 402 or the link controller 406 can instigate, coordinate, cause, or otherwise control signaling across a physical or logical link realized by the interconnect 106 in accordance with one or more protocols. The link controller 402 may be coupled to the interconnect 106. The link controller 406 may also be coupled to the interconnect 106. Thus, the link controller 402 can be coupled to the link controller 406 via the interconnect 106. Each link controller 402 or 406 may, for instance, control communications over the interconnect 106 at a link layer or at one or more other layers of a given protocol. Communication signaling may include, for example, a request 412 (e.g., a write request or a read request), a response 414 (e.g., a write response or a read response), and so forth.

The memory device 108 may further include at least one interconnect 416 and at least one memory controller 418 (e.g., MC 418-1 and MC 418-2). Within the memory device 108, and relative to the target 408, the interconnect 416, the memory controller 418, and/or the DRAM 410 (or other memory component) may be referred to as a "backend" component of the memory device 108. In some cases, the interconnect 416 is internal to the memory device 108 and may operate the same as or differently from the interconnect 106.

As shown, the memory device 108 may include multiple memory controllers 418-1 and 418-2 and/or multiple DRAMs 410-1 and 410-2. The DRAMs 410-1 and 410-2 can be realized in various manners. For example, the DRAMs 410-1 and 410-2 can be multi-die DRAM packages (e.g., n-DP) with, for example, 2, 4, 6, 8, or more dies per package. Although two of each are shown, the memory device 108 may include one or more memory controllers and/or one or more DRAMs. For example, a memory device 108 may include four memory controllers and 16 DRAMs, such as four DRAMs per memory controller. The DRAMs 410-1 and 410-2 and the controllers 418-1 and 418-2 may be configured in single or multiple channels. For example, each controller 418 may support one channel with one or more DRAMs 410 or multiple channels with one or more DRAMs 410. Similarly, each DRAM 410 may be included in a single channel. In another example, a multi-die DRAM may support more than one channel (with one or more controllers 418). The memory components of the memory device 108 are depicted as DRAM as only an example, for one or more of the memory components may be implemented as another type of memory. For instance, the memory components may include nonvolatile memory, such as flash or PCM. Alternatively, the memory components may include other types of volatile memory, such as SRAM. A memory device 108 may also include any combination of memory types.

In some cases, the memory device 108 may include the target 408, the interconnect 416, the at least one memory controller 418, and the at least one DRAM 410 within a single housing or other enclosure. The enclosure, however, may be omitted or may be merged with an enclosure for the host device 104, the system 400, or an apparatus 102 (of FIG. 1). In some cases, each of these components can be realized with a separate IC. In some of such cases, the interconnect 416 can be disposed on a PCB. Each of the target 408, the memory controller 418, and the DRAM 410 may be fabricated on at least one IC and packaged together or separately. For example, the DRAMs 410-1 and 410-2 may be multi-die DRAM packages (e.g., n-DP), such as a multi-die ball-grid array (BGA) package. The packaged ICs may be secured to or otherwise supported by the PCB and may be directly or indirectly coupled to the interconnect 416. In other cases, the target 408, the interconnect 416, and the one or more memory controllers 418 may be integrated together into one IC. In some of such cases, this IC may be coupled to a PCB, and one or more modules for the memory components may also be coupled to the same PCB, which can form a CXL memory device 108. This memory device 108 may be enclosed within a housing or may include such a housing. The components of the memory device 108 may, however, be fabricated, packaged, combined, and/or housed in other manners.

As illustrated in FIG. 4, the target 408, including the link controller 406 thereof, can be coupled to the interconnect 416. Each memory controller 418 of the multiple memory controllers 418-1 and 418-2 can also be coupled to the interconnect 416. Accordingly, the target 408 and each memory controller 418 of the multiple memory controllers 418-1 and 418-2 can communicate with each other via the interconnect 416. Each memory controller 418 is coupled to at least one DRAM 410. As shown, each respective memory controller 418 of the multiple memory controllers 418-1 and 418-2 is coupled to at least one respective DRAM 410 of the multiple DRAMs 410-1 and 410-2. Each memory controller 418 of the multiple memory controllers 418-1 and 418-2 may, however, be coupled to a respective set of multiple DRAMs 410 or other memory components.

Each memory controller 418 can access at least one DRAM 410 by implementing one or more memory access protocols to facilitate reading or writing data based on at least one memory address. The memory controller 418 can increase bandwidth or reduce latency for the memory accessing based on the memory type or organization of the memory components, such as the DRAMs 410. The multiple memory controllers 418-1 and 418-2 and the multiple DRAMs 410-1 and 410-2 can be organized in many different manners. For example, each memory controller 418 can realize one or more memory channels for accessing the DRAMs 410. As noted, the DRAMs 410 can be n-DP packages with multiple arrays or dies. Further, in other implementations, the DRAMs 410 can be manufactured to include one or more ranks, such as a single-rank or a dual-rank memory module. Each DRAM 410 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 420 to the initiator 404. The memory access request 420 may be propagated over a bus or other interconnect that is internal to the host device 104. This memory access request 420 may be or may include a read request or a write request. The initiator 404, such as the link controller 402 thereof, can reformulate the memory access request into a format that is suitable for the interconnect 106. This formulation may be performed based on a physical protocol or a logical protocol (including both) applicable to the interconnect 106. Examples of such protocols are described below.

The initiator 404 can thus prepare a request 412 and transmit the request 412 over the interconnect 106 to the target 408. The target 408 receives the request 412 from the initiator 404 via the interconnect 106. The target 408, including the link controller 406 thereof, can process the request 412 to determine (e.g., extract or decode) the memory access request. Based on the determined memory access request, the target 408 can forward a memory request 422 over the interconnect 416 to a memory controller 418, which is the first memory controller 418-1 in this example. For other memory accesses, the targeted data may be accessed with the second DRAM 410-2 through the second memory controller 418-2.

The first memory controller 418-1 can prepare a memory command 424 based on the memory request 422. The first memory controller 418-1 can provide the memory command 424 to the first DRAM 410-1 over an interface or interconnect appropriate for the type of DRAM or other memory component. The first DRAM 410-1 receives the memory command 424 from the first memory controller 418-1 and can perform the corresponding memory operation. Based on the results of the memory operation, the first DRAM 410-1 can generate a memory response 426. If the memory request 412 is for a read operation, the memory response 426 can include the requested data. If the memory request 412 is for a write operation, the memory response 426 can include an acknowledgement that the write operation was performed successfully. The first DRAM 410-1 can return the memory response 426 to the first memory controller 418-1.

The first memory controller 418-1 receives the memory response 426 from the first DRAM 410-1. Based on the memory response 426, the first memory controller 418-1 can prepare a memory response 428 and transmit the memory response 428 to the target 408 via the interconnect 416. The target 408 receives the memory response 428 from the first memory controller 418-1 via the interconnect 416. Based on this memory response 428, and responsive to the corresponding request 412, the target 408 can formulate a response 414 for the requested memory operation. The response 414 can include read data or a write acknowledgement and be formulated in accordance with one or more protocols of the interconnect 106.

To respond to the memory request 412 from the host device 104, the target 408 can transmit the response 414 to the initiator 404 over the interconnect 106. Thus, the initiator 404 receives the response 414 from the target 408 via the interconnect 106. The initiator 404 can therefore respond to the "originating" memory access request 420, which is from the processor 110 in this example. To do so, the initiator 404 prepares a memory access response 430 using the information from the response 414 and provides the memory access response 430 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 404 and the target 408. Generally, the interconnect 106 can carry memory-related information, such as data or a memory address, between the initiator 404 and the target 408. In some cases, the initiator 404 or the target 408 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 404, to transmit another memory request 412 to the target 408. The target 408 may return credits to "refill" a credit balance at the initiator 404. A credit-based communication scheme across the interconnect 106 may be implemented by credit logic of the target 408 or by credit logic of the initiator 404 (including by both working together in tandem).

In some implementations, a memory, such as the DRAMs 410 or the dies 304, can be realized as a multi-die (e.g., n-DP) package (or as part of such a package). The multiple dies of the package can be programmed to stagger the start of refresh operations for each die upon receiving a command to enter a lower-power mode, or a lower-power refresh mode, such as a self-refresh mode. The stagger can be implemented at a channel level, a package level, or both to reduce peak power draw during the refresh operations, as described in more detail with reference to FIG. 5-1 through FIG. 10.

Consider an example in which the DRAMs 410 are multi-die DRAM packages programmed to insert a delay between the start of refresh operations for each die when a refresh command is received at the memory device 108 (e.g., from the controllers 418), such as a command to enter a self-refresh mode or another refresh mode. Thus, a first die can initiate refresh operations when the command is received, but initiation of refresh operations for a second die (e.g., "after" the first die) is delayed, reducing the peak current draw. Additional dies can be delayed by a similar or different amount of time, thereby staggering the start of refresh operations and reducing the peak current draw and power consumption. In some implementations, the link controller 120 (of FIG. 1) may also or instead guide or support refresh operations of the DRAMs 410 or multiple banks of the dies 304 (of FIG. 3).

In this example, the dies of the DRAMs 410-1 and 410-2 can include or have access to one or more programmable components 126-1 and 126-2, respectively, that can indicate, for each of the multiple dies of the package, a time delay duration. The duration of the delay, if any, may be different for each die. For clarity in FIG. 1, the DRAMs 410 each include one of the programmable components 126. In other implementations, however, each die of the multi-die DRAMs 410 can include associated programmable components 126. The programmable components 126 can be any of a variety of components that can store values or data (e.g., bits). For example, the programmable components can be fuse-based (e.g., fuses and/or anti-fuses) or they can be mode registers or other memory registers, latches, or another type of register (not shown in FIG. 4). The multiple dies can be individually identified using any suitable identification, including a fuse-based identification (e.g., a fuse-ID) or an impedance-based identification (e.g., using a ZQ pin or ball, a ZQ master designation, and so forth).

In example implementations, the multiple dies of the DRAMs 410-1 and 410-2 can include logic 432-1 and 432-2, respectively, that can read or otherwise access the programmable components 126-1 and 126-2 to determine the duration of any time delay associated with the dies. Again, for clarity in FIG. 1, the DRAMs 410 each include one logic 432. In other implementations, however, each die of the multi-die DRAMs 410 can include an associated logic 432. The logic 432 can be, for example, new or existing control logic of the die (e.g., the DRAMs 410-1 and 410-2). In example operations, the logic 432-1 and 432-2 can read the programmable components 126-1 and 126-2, respectively, upon receiving a self-refresh (or other refresh) command at the memory device 108.

The delay may be programmed to the programmable components 126 by either or both of a manufacturer (e.g., a memory fabricator) or a customer (e.g., a customer using the memory in another system or device). For example, to program the programmable components 126 at a factory, an array of fuses or anti-fuses can be programmed (e.g., via a test mode) in a way that describes a duration delay for each die of the multiple dies. Additionally or alternatively, one or more memory registers, such as mode registers, can be made available to customers to program the programmable components 126. In some implementations, the programming may be done at the factory to provide default delay durations and the customer may be able change the default durations. In some implementations, aspects of adaptive refresh staggering can be disabled by, for example, setting all of the delay durations to zero or approximately zero. Example implementations of adaptive refresh staggering are described below with reference to FIGS. 5-1 through 10.

The system 400, the initiator 404 of the host device 104, or the target 408 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over a physical-oriented PCIe standard. For example, the initiator 404 or the target 408 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 402 and the link controller 406 can be CXL controllers.

Example Apparatuses

Figures 1, 5:
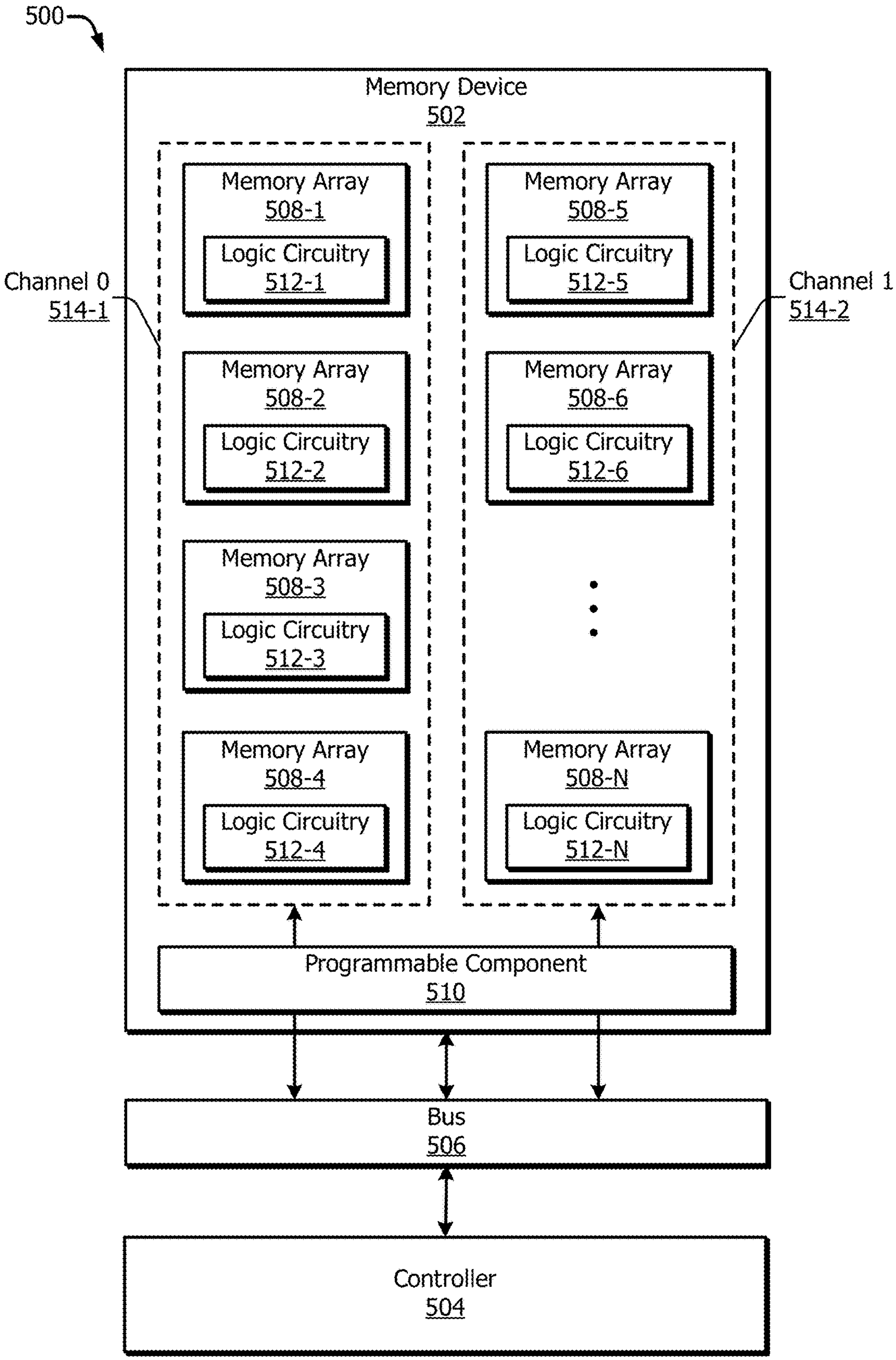
Figures 2, 5:
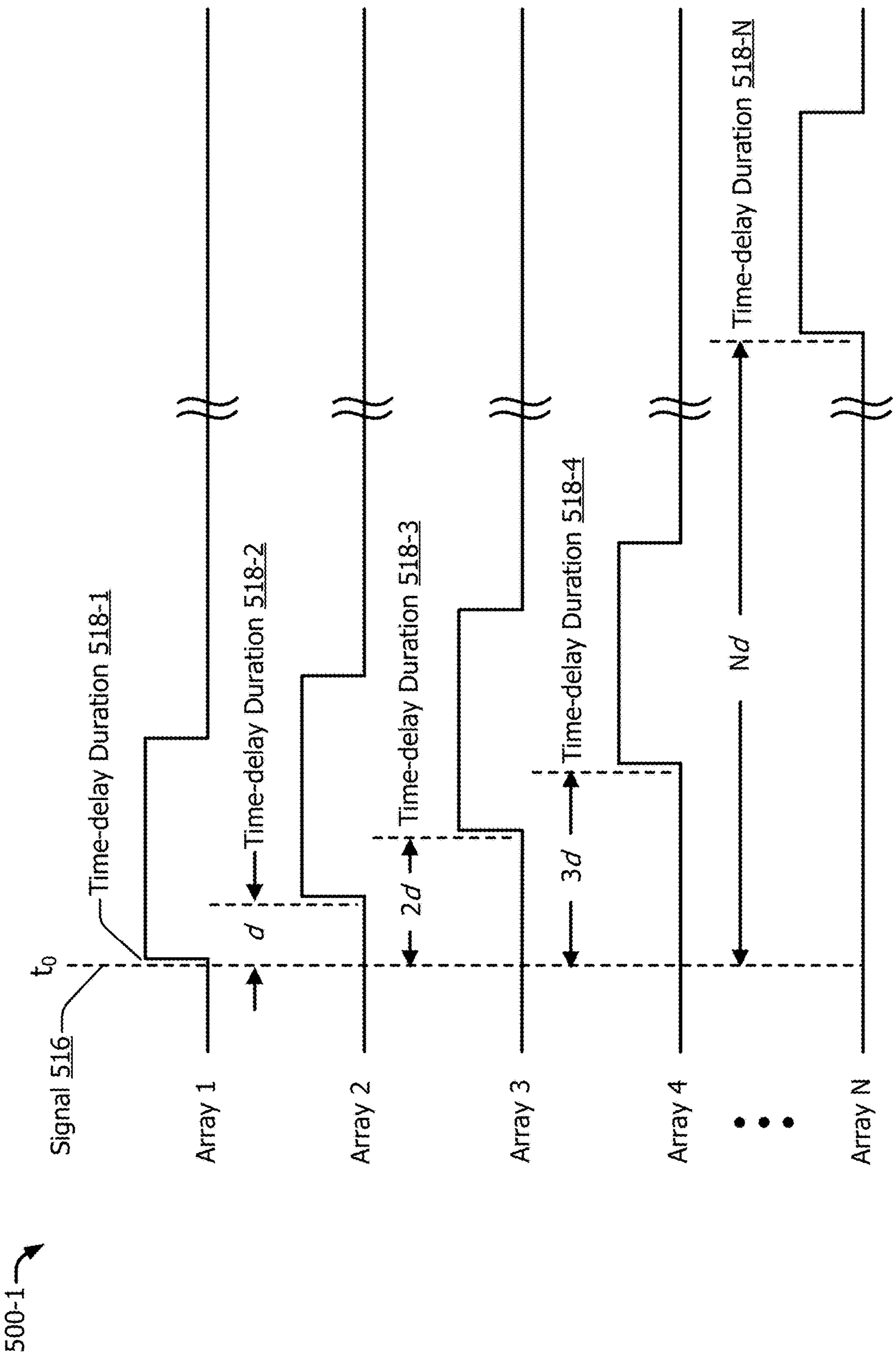

FIG. 5-1 illustrates a portion of an example memory system 500 that can implement aspects of adaptive refresh staggering. The example memory system 500 can include a memory device 502, a controller 504, and a bus 506. The memory device 502 can include multiple memory arrays 508 (arrays 508) and at least one programmable component 510. The arrays 508 can be any of a variety of memory types. For example, the memory arrays 508-1 through 508-N may be dies of a DRAM (e.g., die 0 through die N). In some implementations, the memory device 502 can be realized with, or as part of, one or more of the memory device 108 of FIG. 1, the memory 122 of FIG. 1, the memory module 302 of FIG. 3, or one or more of the DRAMs 410 of FIG. 4.

The arrays 508 can include or be associated with logic circuitry 512 (logic 512), which can be any suitable logic that can be used to enable aspects of adaptive refresh staggering, as described in this document. For example, the arrays 508-1 through 508-N can include logic circuitry 512-1 through 512-N, respectively, as shown in FIG. 5-1. The logic 512 can receive a signal indicative of a command to enter a lower-power refresh mode, such as a self-refresh mode (e.g., from the controller 504). The logic 512 may be coupled, directly or indirectly, to the memory array 508 in any of a number of configurations. For example, the logic circuitry 512 can include or be a part of the logic 204 or the logic 432, as described with reference to FIGS. 1-4. Further, the memory device 502 may also include other components, including those that may be connected to or between illustrated items. For clarity of the illustrated items, these other components are not shown in FIG. 5-1.

The programmable components 510 can be realized as any of a variety of components. For example, the programmable components 510 can be a) fuse-based, such as one or more fuses and/or anti-fuses, b) register-based, such as mode registers or other memory registers, or c) based on another type of component, such as one or more latches. The multiple memory arrays (or dies) 508 can be individually identified using any suitable identification, including a fuse-based identification (e.g., a fuse-ID) or an impedance-based identification (e.g., using a ZQ pin or ball, a ZQ master designation, and so forth). Thus, the memory arrays 508-1 through 508-N may be distinguished from each other based on one or more identification methods. Further, the programmable components 510 can be programmed with an associated delay for each respective array/die 508.

The logic 512 can also determine, for the associated array 508, a duration of a respective time delay related to the lower-power refresh mode and initiate refresh operations for the respective array 508 after the time delay. The durations of the respective time delays can be determined in various manners, such as via fuse-based identification of the respective memory arrays/dies 508 or based on a ZQ identification of the respective memory arrays/dies 508. For example, because each array/die 508 can be identified (e.g., with a fuse- or ZQ-based technique), the logic 512 can read or otherwise access the programmable components 510 to determine a duration of any time delay associated with the associated memory array 508 for staggering initiation of refresh or self-refresh operations, as described above. The logic 512 may be coupled directly or indirectly to the memory array 508 in any of a number of configurations. For example, the logic circuitry 512 can include or be a part of the logic 204 or the logic 432, as described with reference to FIGS. 1-4.

Additionally or alternatively, the multiple memory arrays 508 can be included in a memory package. For example, the memory device 502 can be realized with a multi-die (e.g., n-DP) package (or as part of such a package), and the memory arrays 508 can be realized as dies of the multi-die package. In some implementations, the multiple arrays 508 of the memory device 502 can be divided into multiple memory channels 514, as shown in FIG. 5-1. Aspects of adaptive refresh staggering can thus be implemented at a channel level (e.g., the staggering is applied to arrays/dies on a per-channel basis).

For example, an array 508-1 can be included in a channel 514-1 (e.g., channel 0). The logic 512-1 can determine that the duration of the time delay for the array 508-1 is approximately zero and initiate refresh operations when the signal indicative of the command to enter the lower-power refresh mode is received (e.g., because the time delay is approximately zero). As shown in FIG. 5-1, other arrays 508-2 through 508-4 are also included in the memory channel 514-1. The other arrays 508-2 through 508-4 can determine durations of respective time delays and initiate refresh operations sequentially, subsequent to initiation of refresh operations by the array 508-1. Thus, the array 508-2 determines a time-delay duration and then initiates refresh operations when the duration ends. Similarly, the other arrays 508 of the channel 514-1 determine their time-delay durations and initiate refresh operations when the respective durations end. As noted, the logic 512 can read or otherwise access the programmable components 510 to determine the duration of any time delay.

The durations of the respective time delays for the arrays 508-2 through 508-4 can be approximately a same duration or different durations. In either case (e.g., the durations of the respective time delays for the arrays 508-2 through 508-4 being different or approximately the same), the durations can be approximately 30 nanoseconds (ns), 100 ns, 150 ns, 200 ns, or 300 ns. The time-delay duration(s) may be programmed by a manufacturer (e.g., a memory fabricator) or a customer (e.g., a customer using the memory in another system or device). In some implementations, the time-delay durations may be set to approximately zero (e.g., turning aspects of adaptive refresh staggering off).

The durations of the time delays can be cumulative from receipt of the signal indicative of the command to enter the lower-power refresh mode. Thus, in an example implementation in which the time delays have approximately the same duration, the duration for the array 508-1 is approximately zero, the duration for the array 508-2 is (approximately) d, the duration for the array 508-3 is 2d, and the duration for the array 508-4 is 3d. In other implementations, the durations of the time delays can be determined via (e.g., based on or counting from) the initiation of refresh operations for each array's "predecessor array," and thus the duration of the delay for the array 508-1 is approximately zero and the durations of the delays for the arrays 508-2 through 508-4 are all approximately d (in cases in which the time delays have approximately the same duration).

Consider FIG. 5-2, which illustrates generally at 500-1 example timing and signaling operations that can be used with logic circuitry (e.g., the logic circuitry 512, 432, or 204) to implement aspects of adaptive refresh staggering with a memory device. For example, staggering the refresh operations, as described with reference to FIG. 5-1, can lower peak power (e.g., current) consumed for a given refresh operation (e.g., self-refresh). The example timing and signaling operations include an example signal diagram for a memory device that includes "N" memory arrays 508 in one channel, labeled array 1 through array N (e.g., the memory device 502). For example, in some implementations the memory arrays can be dies of a multi-die package (e.g., dies 0-N, or a ZQ master die and non-master dies 0 through N−2).

In the example timing and signaling operations shown in FIG. 5-2, at time to, the memory device receives a signal 516 indicative of the command to enter the lower-power refresh mode. Array 1 then determines a time-delay duration 518-1, which is approximately zero, and initiates refresh operations, as shown by a step function in the signal diagram. Similarly, Arrays 2 through N determine durations 518-2 through 518-N of d, 2d, 3d, and Nd, respectively. Thus, Array 2 initiates refresh operations after the duration 518-2, Array 3 initiates refresh operations after the duration 518-3, Array 4 initiates refresh operations after the duration 518-4, and Array N initiates refresh operations after the duration 518-N.

Because of the time-delay durations 518, implementing adaptive refresh staggering may slightly increase system latency and/or refresh efficiency, but it can also reduce peak power draw during refresh or self-refresh operations. Reducing power consumption allows memory designers and engineers to make tradeoffs between training accuracy, power distribution network limitations and overall memory latency, which can enable solutions for different customers and product-design parameters. Adjustments to the time-delay lengths may be used to manage the tradeoff for particular implementations, based on factors such as costs and complexity of local- and device-level power delivery networks. For example, in implementations with a robust power delivery network or in which reducing latency is critical, the time-delay duration may be reduced or turned off. In other implementations in which reducing peak power consumption is a primary design consideration, the duration of the time delay can be adjusted to achieve a desired performance level.

Returning to FIG. 5-1, some implementations of the memory device 502 include multiple channels. For example, consider an implementation in which the multiple arrays 508 of the memory device 502 are divided into the two channels 514-1 and 514-2. The first channel 514-1 includes the memory arrays 508-1 through 508-4 (e.g., at least two memory arrays 508), and the second channel 514-2 includes memory arrays 508-5 through 508-N (e.g., at least two memory arrays of the multiple memory arrays).

In some implementations, the lower-power refresh mode may be channel independent. That is, the signal indicative of the command to enter the lower-power refresh mode is directed to (e.g., effective for) one memory channel 514 (e.g., for memory channel 514-1), independently from other channels (e.g., the memory channel 514-2). In this case, the logic circuitry 512 for the arrays 508 of the memory channel 514-1 can determine respective time-delay durations for the arrays 508 of the memory channel 514-1. For example, the logic 512-1 can determine the duration of the time delay for the memory array 508-1 and initiate refresh operations when the first duration ends (e.g., a duration of approximately zero).

The other logic circuitries 512-2, 512-3, and 512-4 associated with the other arrays 508 of the memory channel 514-1 determine the durations of their respective time delays and initiate refresh operations when the respective durations end. The durations for the other arrays 508 can be greater than that for the array 508-1 (e.g., approximately 30 nanoseconds (ns), 100 ns, 150 ns, 200 ns, or 300 ns) and the same as, or different from, each other. Thus, for example, refresh operations for the array 508-1 are initiated when the signal indicative of the command to enter the lower-power refresh mode is received (e.g., after a duration of approximately zero). Then, after the respective associated time-delay durations, refresh operations are initiated for the memory arrays 508-2 through 508-4.

Similarly, the signal indicative of the command to enter the lower-power refresh mode can be directed to (e.g., effective for) another memory channel 514 (e.g., for memory channel 514-2), independently from other channels (e.g., the memory channel 514-1). In this case, the logic circuitry 512 for the arrays 508 of the memory channel 514-2 can determine respective time-delay durations for the arrays 508 of the memory channel 514-2. For example, the logic 512-5 can determine the duration of the time delay for the memory array 508-5 and initiate refresh operations when the first duration ends (e.g., a duration of approximately zero).

The other logic circuitries 512-6 through 512-N associated with the other arrays 508 of the memory channel 514-2 determine the durations of their respective time delays and initiate refresh operations when the respective durations end. The durations for the other arrays 508 can be greater than that for the array 508-5 (e.g., approximately 30 nanoseconds (ns), 100 ns, 150 ns, 200 ns, or 300 ns) and the same as, or different from, each other. Thus, for example, refresh operations for the array 508-5 are initiated when the signal indicative of the command to enter the lower-power refresh mode is received (e.g., after a duration of approximately zero). Then, after the respective associated time-delay durations, refresh operations are initiated for the memory arrays 508-6 through 508-N.

The controller 504 can be a controller or processor that can transmit signals to the memory device 502 and the memory arrays 508. For example, the controller 504 can be realized as or with the link controller 120 of FIG. 1, the control circuitry 210 of FIG. 2, or the memory controllers 418 of FIG. 4. The bus 506 can be any suitable bus or other interconnect that can be used to transmit signals and/or data between the memory device 502 and the controller 504. In some implementations, the bus may be realized as or with the interconnect 106 or the interconnect 416.

Figures 1, 6:
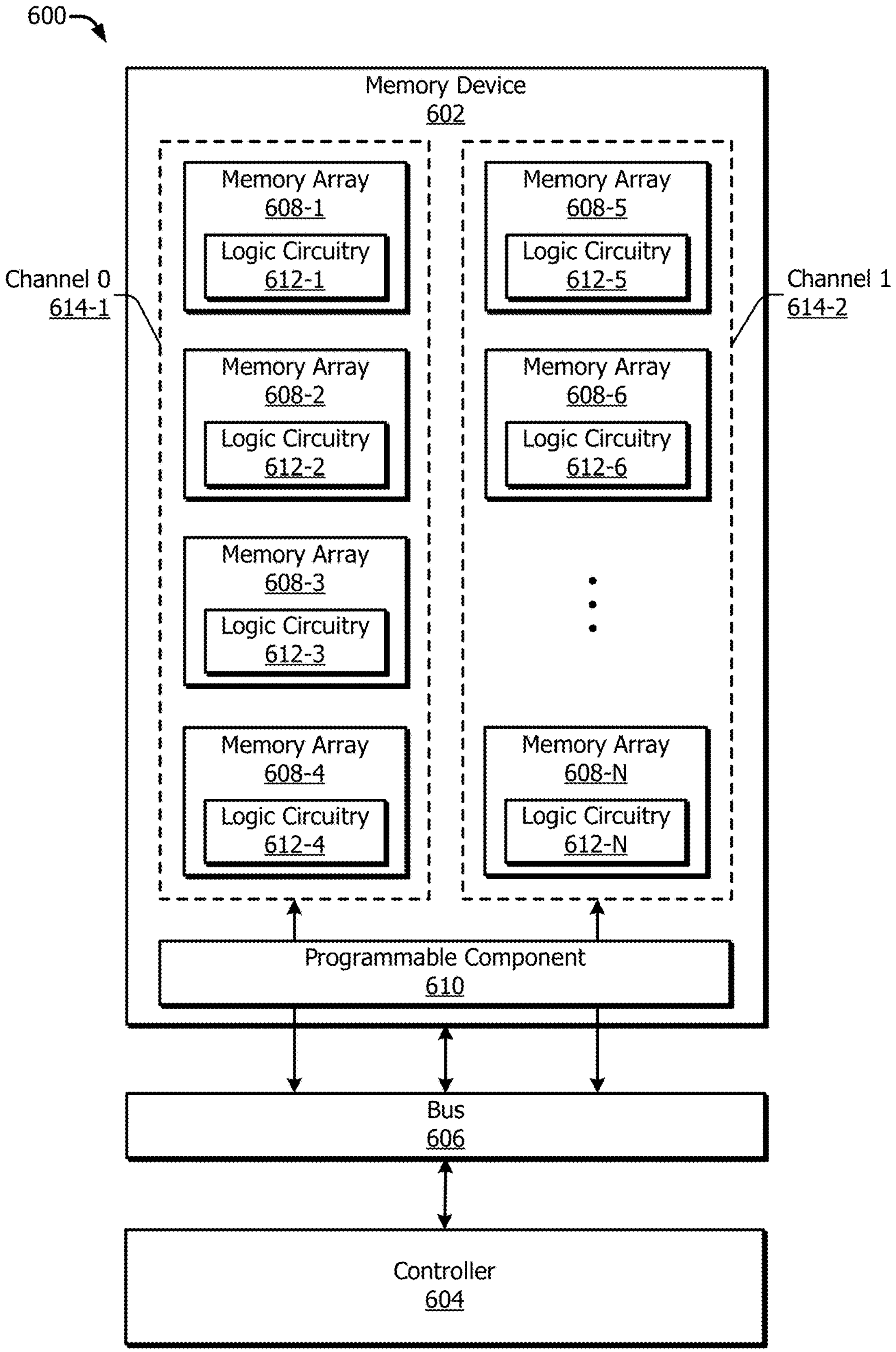
Figures 2, 6:
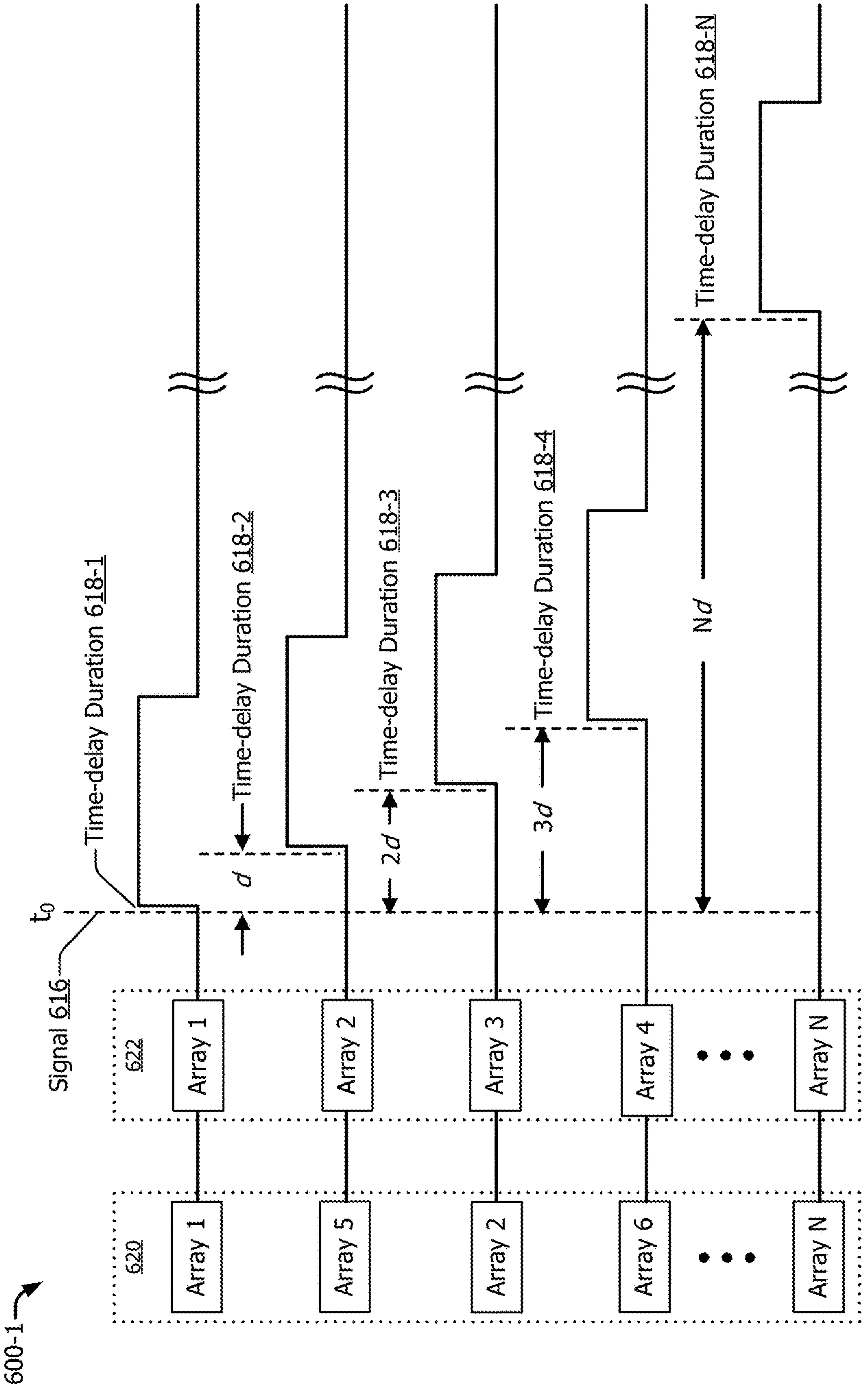

FIG. 6-1 illustrates a portion of another example memory system 600 that can implement aspects of adaptive refresh staggering. The example memory system 600 can include a memory device 602, a controller 604, and a bus 606. The memory device 602 can include multiple memory arrays 608 (arrays 608) and at least one programmable component 610. The arrays 608 can be any of a variety of memory types. For example, the memory arrays 608-1 through 608-N may be dies of a DRAM (e.g., die 0 through die N). In some implementations, the memory device 602 can be realized with, or as part of, one or more of the memory device 108 of FIG. 1, the memory 122 of FIG. 1, the memory module 302 of FIG. 3, one or more of the DRAMs 410 of FIG. 4, and/or the memory device 502 of FIG. 5.

The arrays 608 can include or be associated with logic circuitry 612 (logic 612), which can be any suitable logic that can be used to enable aspects of adaptive refresh staggering, as described in this document. For example, the arrays 608-1 through 608-N can include logic circuitry 612-1 through 612-N, respectively, as shown in FIG. 6-1. The logic 612 can receive a signal indicative of a command to enter a lower-power refresh mode, such as a self-refresh mode (e.g., from the controller 604). The logic 612 may be coupled directly or indirectly to the memory array 608 in any of a number of configurations. For example, the logic circuitry 612 can include or be a part of the logic 204, the logic 432, or the logic 512, as described with reference to FIGS. 1 through 5-2. Further, the memory device 602 may also include other components, including those that may be connected to or between illustrated items. For clarity of the illustrated items, these other components are not shown in FIG. 6-1.

The programmable components 610 can be realized as any of a variety of components. For example, the programmable components 610 can be a) fuse-based, such as one or more fuses and/or anti-fuses, b) register-based, such as mode registers or other memory registers, or c) based on another type of component, such as one or more latches. The multiple memory arrays (or dies) 608 can be individually identified using any suitable identification, including a fuse-based identification (e.g., a fuse-ID) or an impedance-based identification (e.g., using a ZQ pin or ball, a ZQ master designation, and so forth). Thus, the memory arrays 608-1 through 608-N may be distinguished from each other based on one or more identification methods. Further, the programmable components 610 can be programmed with an associated delay for each respective array/die 608.

The logic 612 can also determine, for the associated array 608, a duration of a respective time delay related to the lower-power refresh mode and initiate refresh operations for the respective array 608 after the time delay. The durations of the respective time delays can be determined in various manners, such as via fuse-based identification of the respective memory arrays/dies 608 or based on a ZQ identification of the respective memory arrays/dies 608. For example, because each array/die 608 can be identified (e.g., with a fuse- or ZQ-based technique), the logic 612 can read or otherwise access the programmable components 610 to determine a duration of any time delay associated with the associated memory array 608 for staggering initiation of refresh or self-refresh operations, as described above. The logic 612 may be coupled directly or indirectly to the memory array 608 in any of a number of configurations. For example, the logic circuitry 612 can include or be a part of the logic 204 of FIG. 2 or the logic 432 of FIG. 4, as described with reference to FIGS. 1-4.

Additionally or alternatively, the multiple memory arrays 608 can be included in a memory package. For example, the memory device 602 can be realized with a multi-die (e.g., n-DP) package (or as part of such a package), and the memory arrays 608 can be realized as dies of the multi-die package. Aspects of adaptive refresh staggering can thus be implemented at a package level (e.g., the staggering applies to arrays/dies on a per-package basis). In some implementations, the multiple arrays 608 of the memory device 602 can be divided into multiple memory channels 614 (e.g., the memory channels 614-1 and 614-2), as shown in FIG. 6-1.

Consider an implementation in which the multiple arrays 608 of the memory device 602 are divided into the two channels 614-1 and 614-2. The first channel 614-1 includes the memory arrays 608-1 through 608-4 (e.g., at least two memory arrays 608), and the second channel 614-2 includes the memory arrays 608-5 through 608-N (e.g., at least two memory arrays of the multiple memory arrays).

In some implementations, the channels 614-1 and 614-2 may be synchronized (e.g., "lock-step" or "parallel" operations). In these implementations, the command to enter the lower-power refresh mode may be directed to or effective for both/all synchronized memory channels. That is, the signal indicative of the command to enter the lower-power refresh mode is directed to or effective for the memory channel 614-1 at a same or nearly same time as for the memory channel 614-2. In this case, the logic circuitry 612 for the arrays 608 of the memory device 602 can determine respective time-delay durations for the arrays 608 of the memory device 602 and initiate refresh operations after the time delay(s).

For example, the logic 612-1 can determine the duration of the time delay for the memory array 608-1 and initiate refresh operations when the first duration ends (e.g., a duration of approximately zero). The other logic circuitries 612-2 through 612-N determine the durations of their respective time delays and initiate refresh operations subsequent to initiation of refresh operations at the array 608-1 and after the respective durations end. As noted, the logic 612 can read or otherwise access the programmable components 610 to determine the duration of any time delay. The durations for the other arrays 608 can be greater than that for the array 608-1 (e.g., approximately 30 nanoseconds (ns), 100 ns, 150 ns, 200 ns, or 300 ns) and the same as, or different from, each other. Thus, for example, refresh operations for the array 608-1 are initiated when the signal indicative of the command to enter the lower-power refresh mode is received (e.g., after a duration of approximately zero). Then, after the respective associated time-delay durations, refresh operations are initiated for the memory arrays 608-2 through 608-4.

As noted with respect to FIG. 5-1, the time-delay duration(s) may be programmed by a manufacturer (e.g., a memory fabricator) or a customer (e.g., a customer using the memory in another system or device). In some implementations, the time-delay durations may be set to approximately zero (e.g., turning aspects of adaptive refresh staggering off). Further, the durations of the time delays can be cumulative from receipt of the signal indicative of the command to enter the lower-power refresh mode. Thus, in an example implementation in which the time delays have approximately the same duration, the duration for the array 608-1 is approximately zero, the duration for the array 608-2 is (approximately) d, the duration for the array 608-3 is 2d., and the duration for the array 608-N is Nd. In other implementations, the durations of the time delays can be determined via (e.g., based on or counting from) the initiation of refresh operations for each array's "predecessor array," and thus the duration of the delay for the array 608-1 is approximately zero and the durations for the arrays 608-2 through 608-N are all approximately d (in cases in which the time delays have approximately the same duration).

In implementations in which the memory device 602 includes multiple memory channels 614, the order in which the arrays initiate refresh operations can vary. For example, the array 608-1 (or the logic 612-1) can initiate refresh operations when the signal indicative of the command to enter the lower-power mode is received, after a determination (e.g., by the logic 612-1) that the duration of the time delay for the array is approximately zero. The other arrays 608-2 through 608-N (or the associated logic 612) can initiate refresh operations sequentially, subsequent to initiation of refresh operations by the array 608-1 and after the associated durations of the respective time delays.

As shown in FIG. 6-1, the memory channels 614-1 and 614-2 include the multiple memory arrays 608. In some implementations, the sequential refresh operations of the arrays 608-2 through 608-N can proceed, after initiation of refresh operations for the first array, in a pattern that alternates between arrays of the multiple memory channels. For example, after initiation of refresh operations for the array 608-1 (the first array), the initiation of refresh operations proceeds (after appropriate time delays) in an alternating pattern such as the following: the array 608-5, the array 608-2, the array 608-6, the array 608-3, and so forth.

In other implementations, the sequential refresh operations of the arrays 608-2 through 608-N can proceed in a pattern in which refresh operations for each of the respective arrays 608 of the channel 614 that includes the array 608-1 (e.g., the channel 614-1) are complete before refresh operations for the arrays 608 of another channel (e.g., 614-2) are initiated. For example, after initiation of refresh operations for the array 608-1 (the first array), the initiation of refresh operations proceeds (after appropriate time delays) in a pattern such as the following: the array 608-2, the array 608-3, the array 608-4, the array 608-5, the array 608-6, and so forth.

Consider FIG. 6-2, which illustrates generally at 600-1 example timing and signaling operations that can be used with logic circuitry (e.g., the logic circuitry 612, 432, 512, or 204) to implement aspects of adaptive refresh staggering with a memory device. For example, staggering the refresh operations, as described with reference to FIG. 6-1, can lower peak power (e.g., current) consumed for a given refresh operation (e.g., self-refresh). The example timing and signaling operations include an example signal diagram for a memory device that includes "N" memory arrays divided into two channels (e.g., "N" memory arrays 608), labeled array 1 through array N (e.g., the memory device 602). For this example, assume that one channel includes arrays 1 through 4 and the other channel includes arrays 5 through N. For example, the memory arrays can be dies of a multi-die package (e.g., dies 0-N, or a ZQ master die and non-master dies 0 through N−2).

In the example timing and signaling operations shown in FIG. 6-2, at time to, the memory device receives a signal 616 indicative of the command to enter the lower-power refresh mode. Array 1 then determines a time-delay duration 618-1, which is approximately zero, and initiates refresh operations, as shown by a step function in the signal diagram. Similarly, Arrays 2 through N determine durations 618-2 through 618-N of d, 2d, 3d, and Nd, respectively. Thus, in implementations with the alternating pattern, as described above and shown in a dotted-line box 620, after the duration 618-1, Array 5 initiates refresh operations after the duration 618-2. Then, Array 2 initiates refresh operations after the duration 618-3. The alternating patter continues with Array 6, then with Array 3, then with Array 7, and so forth until Array N initiates refresh operations after the duration 618-N.

In other implementations without the alternating pattern, as described above and shown in another dotted-line box 622, Array 2 initiates refresh operations after the duration 618-2, Array 3 initiates refresh operations after the duration 618-3, Array 4 initiates refresh operations after the duration 618-4, and Array N initiates refresh operations after the duration 618-N. In some memory device/system configurations, the alternating-pattern implementation may be more efficient than non-alternating implementations because both channels are being refreshed while the memory device/system is in the lower-power refresh mode.

Because of the time-delay durations 618, implementing adaptive refresh staggering may increase system latency and/or decrease refresh efficiency, but it can also reduce peak power draw during refresh or self-refresh operations. Reducing power consumption allows memory designers and engineers to make tradeoffs between training accuracy, power distribution network limitations, and overall memory latency, which can enable solutions for different customers and product-design parameters. Adjustments to the time-delay lengths may be used to manage the tradeoffs for particular implementations, based on factors such as costs and complexity of local- and device-level power delivery networks. For example, in implementations with a robust power delivery network or in which reducing latency is critical, the time-delay duration may be reduced or turned off. In other implementations in which reducing peak power consumption is a primary design consideration, the duration of the time delay can be adjusted to provide a desired performance level.

Returning to FIG. 6-1, the controller 604 can be a controller or processor that can transmit signals to the memory device 602 and the memory arrays 608. For example, the controller 604 can be realized as or with the link controller 120, the control circuitry 210, or the memory controllers 418. The bus 606 can be any suitable bus or other interconnect that can be used to transmit signals and/or data between the memory device 602 and the controller 604. In some implementations, the bus may be realized as or with the interconnect 106 or the interconnect 416.

In some implementations, the example memory systems 500 and/or 600 may be implemented as part of another device, such as the memory device 108 (e.g., with or as part of the memory 122), the memory module 302, or the DRAM 410. Further, the techniques, or aspects of the techniques, described with respect to FIGS. 5-1, 5-2, 6-1, and 6-2 may be combined to obtain additional benefits. Additionally or alternatively, the example memory systems 500 and/or 600 may be implemented as part of a CXL device (e.g., a Type 1 CXL device, a Type 2 CXL device, or a Type 3 CXL device). For example, the memory systems 500 and/or 600 can include or be coupled to an interface that can couple to a host device (e.g., the host device 104) via an interconnect, such as the interconnect 106. The memory systems 500 and/or 600 can also include or be coupled to a link controller (e.g., the link controller 406) that can be coupled to the interface and communicate with the host device. In some implementations, the interconnect can be an interconnect that can comport with at least one Compute Express Link (CXL) standard, and the link controller may be a CXL controller. In any of these configurations, the memory arrays of the memory systems 500 and/or 600 can comport with one or more low-power double data rate memory standards (e.g., LPDDR4.x, LPDDR5.x, or LPDDR6).

Example Methods

Figure 7:
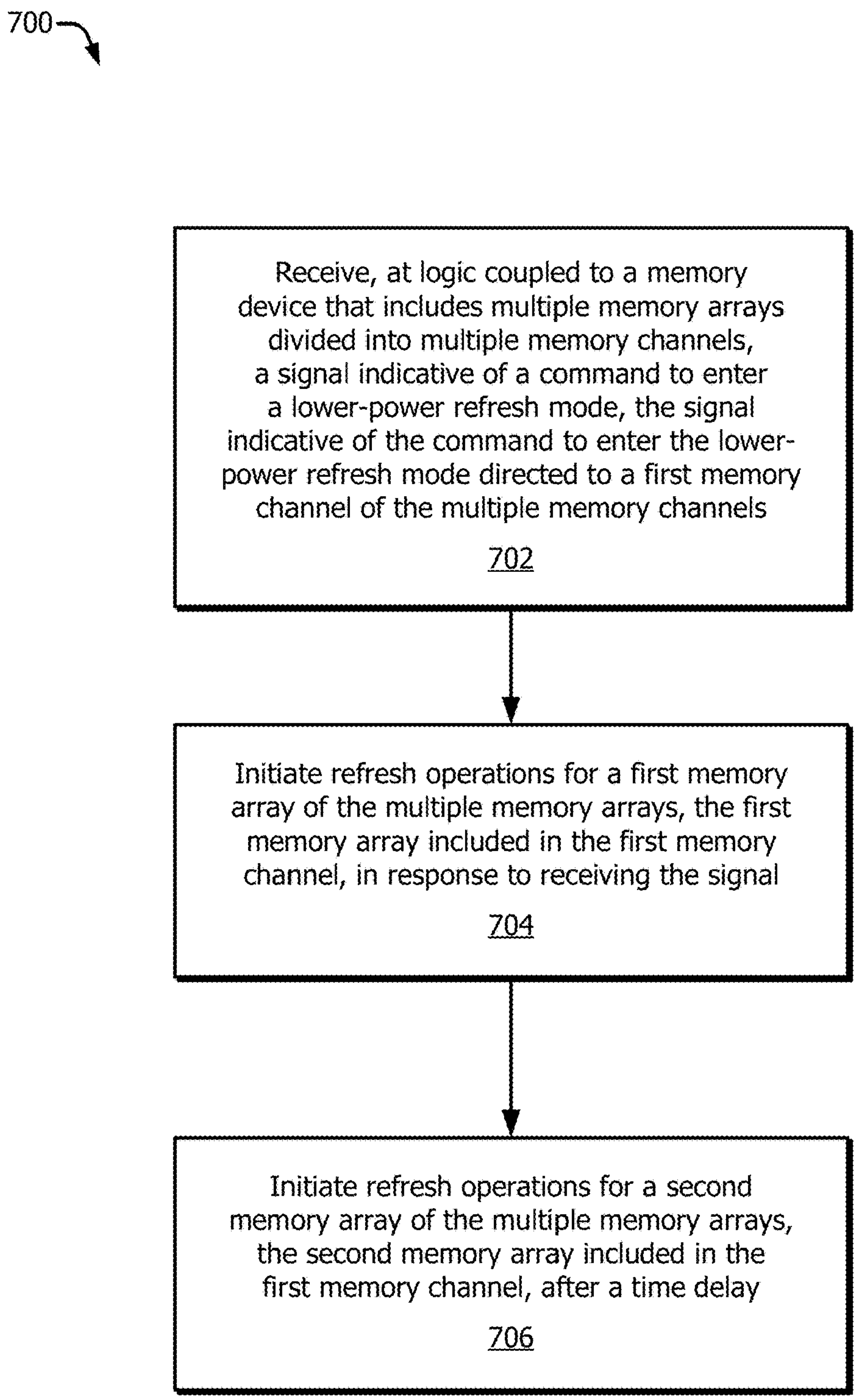
FIG. 7 illustrates a flow diagram for an example process that can implement aspects of adaptive refresh staggering.

This section describes example methods with reference to the flow diagram of FIG. 7 for implementing aspects of adaptive refresh staggering. These descriptions may also refer to components, entities, and other aspects depicted in FIG. 1 through FIG. 6-2, to which reference is made only by way of example.

FIG. 7 illustrates a flow diagram for an example process 700 that can implement aspects of adaptive refresh staggering. At block 702, logic coupled to a memory device that includes multiple memory arrays divided into multiple memory channels receives a signal indicative of a command to enter a lower-power refresh mode. For example, the memory device 108 (including the multi-die package 124), the memory module 302, the memory device 502, or the memory device 602 can receive the signal (e.g., the signal 516 or 616). The multiple memory channels can be, for example, the memory channels 514 or 614 as shown in FIGS. 5-1 and 6-1, respectively. In some cases, the signal may be a command or another signal to enter a self-refresh mode and may be directed to less than all of the multiple memory channels (e.g., the signal indicative of the command to enter the lower-power refresh mode can be directed to a first memory channel of the multiple memory channels).

At block 704, refresh operations for a first memory array of the multiple memory arrays are initiated in response to receiving the signal indicative of the command to enter the lower-power refresh mode. The first memory array can be included in a first memory channel of the multiple memory channels. In some implementations, the memory arrays may be memory dies of a multi-die memory device. For example, the first array can be an array/die of the multi-die package 124 or the DRAM 410. In other cases, the first array can be the array 508-1 or the array 608-1. In this example, the first array can initiate a self-refresh operation in response to receiving the signal (e.g., the signal 516 or 616). In some cases, refresh operations for the array/die can be initiated through an associated logic, such as the logic 204, the logic 432, the logic 512, or the logic 612.

At block 706, refresh operations for another (e.g., a second) memory array of the multiple memory arrays are initiated after a time delay. The other memory array can be included in the first memory channel of the multiple memory channels or in another memory channel of the multiple memory channels. For example, the other array can be another array/die of the multi-die package 124, the DRAM 410, the memory device 502 (e.g., the array 508-2), or the memory device 602 (e.g., the array 608-2). In some implementations, the time delay can be determined by the associated logic described above. The duration of the time delay can be determined in various manners, such as via fuse-based identification of the respective memory array/die or based on a ZQ identification of the respective memory arrays/dies, as described above. For example, the logic 204, the logic 432, the logic 512, or the logic 612 can determine the time-delay duration by reading or otherwise accessing a programmable component that has been programmed with a time-delay duration for each array/die, such as the programmable component 126, 510, or 610. The duration of the time delay may take various values, such as approximately 30 nanoseconds (ns), 100 ns, 150 ns, 200 ns, or 300 ns.

Continuing the example described in the example process 700, refresh operations for another (e.g., a third) memory array of the multiple memory arrays can be initiated after another time delay. For example, the other array can be another array/die of the multi-die package 124, the DRAM 410, the memory device 502 (e.g., the array 508-3), or the memory device 602 (e.g., the array 608-3). In some implementations, the durations of the time delay before the refresh operations for the second array and of the time delay before refresh operations for the third array can be approximately a same duration. In other implementations, the durations can be different.

In some implementations, the multiple memory channels can be independent, as described with reference to FIGS. 5-1 through 6-2. Thus, aspects of adaptive refresh staggering can be implemented at a channel level. In other words, the start of refresh operations for each array/die can be staggered on a per-channel basis (e.g., the staggering is applied to arrays/dies for each channel independently of other channels). Examples of this implementation are presented below.

Figure 8:
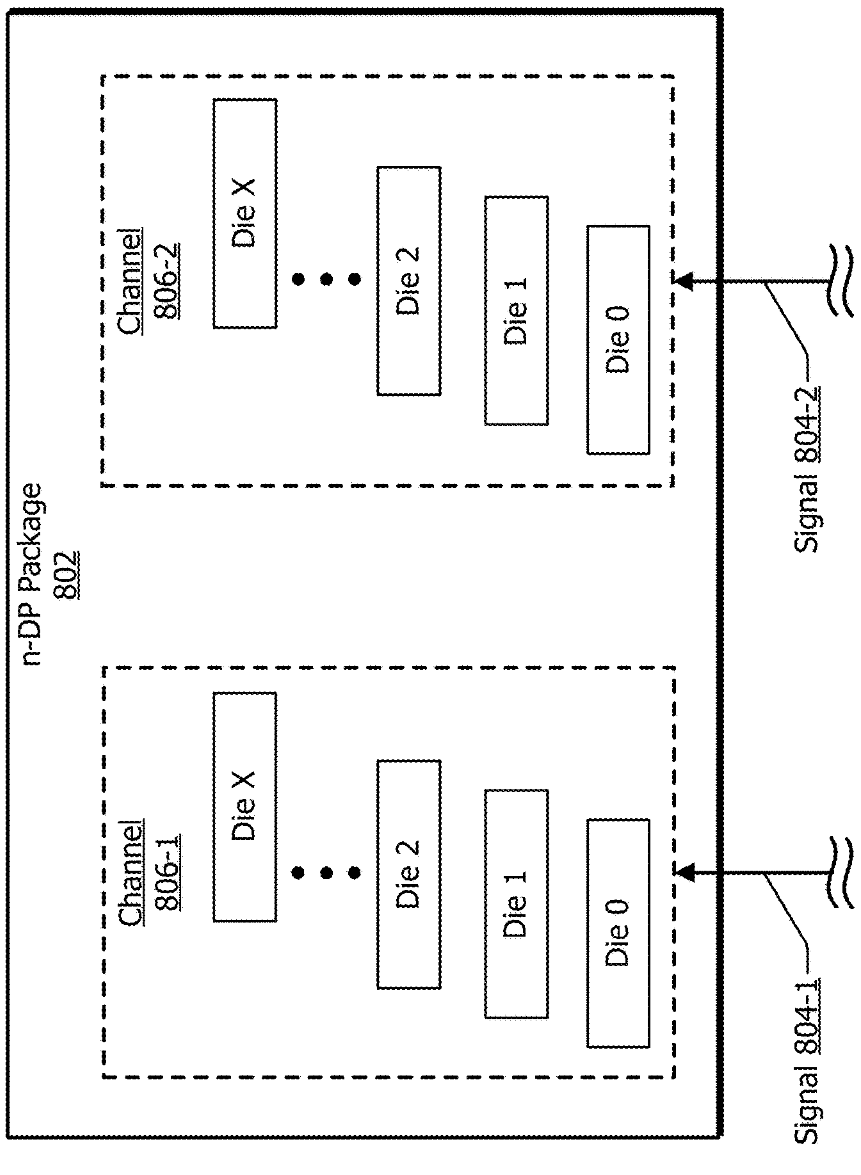
FIG. 8 illustrates a portion of an example memory system that can implement aspects of the example process of FIG. 7.

Consider FIG. 8, which illustrates a portion of an example memory system 800 that can implement aspects of the example process of FIG. 7. The example memory system 800 includes a multi-die package 802, in which the multiple memory arrays of the memory device are divided into multiple memory channels. For this example, assume the memory channels are independent and aspects of adaptive refresh staggering are applied at the channel level. Thus, a signal 804-1 indicative of a command to enter a lower-power refresh mode can be directed to (e.g., effective for) a first memory channel 806-1 of the multiple memory channels, which includes at least two memory arrays/dies. As shown in FIG. 8, the memory channel 806-1 includes “X” arrays, shown as die 0 through die X. In response to receiving the signal 804-1 at logic associated with die 0 of the channel 806-1 (e.g., the logic 204, the logic 432, the logic 512, or the logic 612), die 0 can initiate refresh operations (e.g., after a time delay of approximately zero). The other dies of the channel 806-1 (e.g., die 1 through die X) can then initiate refresh operations after corresponding time delays, as described above.

Similarly, a signal 804-2 indicative of another command to enter the lower-power refresh mode can be directed to (e.g., effective for) another memory channel 806-2, which also includes at least two memory arrays/dies. As shown in FIG. 8, the memory channel 806-2 includes "X" arrays, shown as die 0 through die X. Accordingly, in response to receiving the signal 804-2 at logic associated with die 0 of the channel 806-2 (e.g., the logic 204, the logic 432, the logic 512, or the logic 612), die 0 can initiate refresh operations (e.g., after a time delay of approximately zero). The other dies of the channel 806-2 (e.g., die 1 through die X) can then initiate refresh operations after corresponding time delays, as described above.

Figure 9:
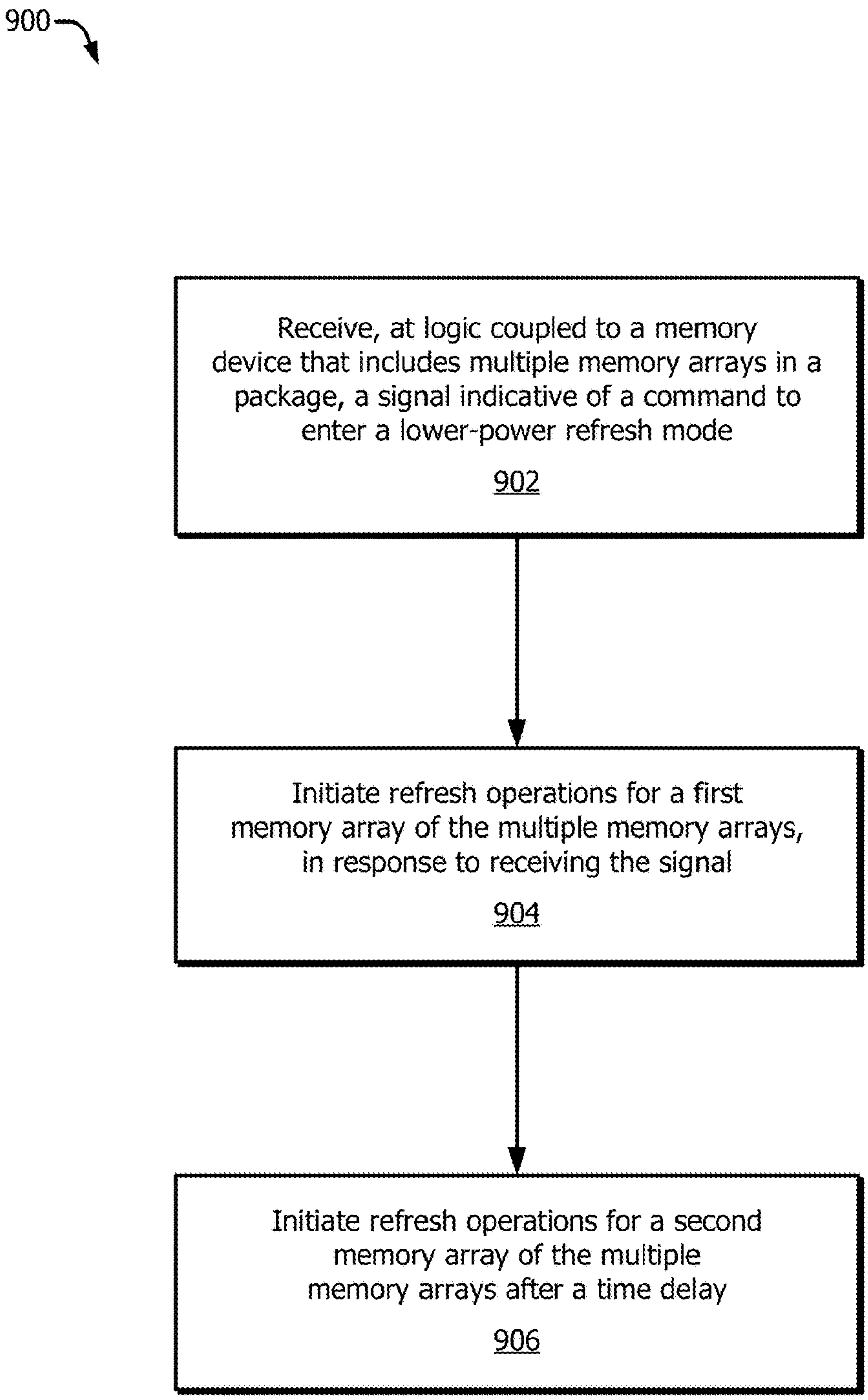
FIG. 9 illustrates a flow diagram for another example process that can implement aspects of adaptive refresh staggering.

FIG. 9 illustrates a flow diagram for another example process 900 that can implement aspects of adaptive refresh staggering. At block 902, logic coupled to a memory device that includes multiple memory arrays in a package receives a signal indicative of a command to enter a lower-power refresh mode. For example, the memory device 108 (including the multi-die package 124), the memory module 302, the memory device 502, or the memory device 602 can receive the signal (e.g., the signal 516 or 616). The package can be, for example, a multi-die package (e.g., an n-DP DRAM package) such as the multi-die package 124. In other cases, the package can be the memory module 302, the DRAM 410, the memory device 502, or the memory device 602. In some cases, the signal may be a command or another signal to enter a self-refresh mode.

At block 904, refresh operations for a first memory array of the multiple memory arrays are initiated in response to receiving the signal indicative of the command to enter the lower-power refresh mode. In some implementations, the memory arrays may be memory dies of a multi-die memory device. For example, the first array can be an array/die of the multi-die package 124 or the DRAM 410. In other cases, the first array can be the array 508-1 or the array 608-1. In this example, the first array can initiate a self-refresh operation in response to receiving the signal (e.g., the signal 516 or 616). In some cases, refresh operations for the array/die can be initiated through an associated logic, such as the logic 204, the logic 432, the logic 512, or the logic 612.

At block 906, refresh operations for another (e.g., a second) memory array of the multiple memory arrays are initiated after a time delay. For example, the other array can be another array/die of the multi-die package 124, the DRAM 410, the memory device 502 (e.g., the array 508-2), or the memory device 602 (e.g., the array 608-2). In some implementations, the time delay can be determined by the associated logic described above. The duration of the time delay can be determined in various manners, such as via fuse-based identification of the respective memory array/die or based on a ZQ identification of the respective memory array/die, as described above. For example, the logic 204, the logic 432, the logic 512, or the logic 612 can determine the time-delay duration by reading or otherwise accessing a programmable component that has been programmed with a time-delay duration for each array/die, such as the programmable component 126, 510, or 610. The duration of the time delay may take various values, such as approximately 30 nanoseconds (ns), 100 ns, 150 ns, 200 ns, or 300 ns.

Continuing the example described in the example process 900, refresh operations for another (e.g., a third) memory array of the multiple memory arrays can be initiated after another time delay. For example, the other array can be another array/die of the multi-die package 124, the DRAM 410, the memory device 502 (e.g., the array 508-3), or the memory device 602 (e.g., the array 608-3). In some implementations, the durations of the time delay before the refresh operations for the second array and of the time delay before refresh operations for the third array can be approximately a same duration. In other implementations, the durations can be different.

In some implementations, the multiple memory channels can be configured for synchronized or "lock-step" operation, as described with reference to FIGS. 5-1 through 6-2. Thus, aspects of adaptive refresh staggering can be implemented at a package level. In other words, the start of refresh operations for each array/die can be staggered on a per-package basis (e.g., the staggering is applied to the arrays/dies of each package of the memory device or system even if the arrays/dies of the package are divided into channels). Examples of this implementation are presented below.

Figure 10:
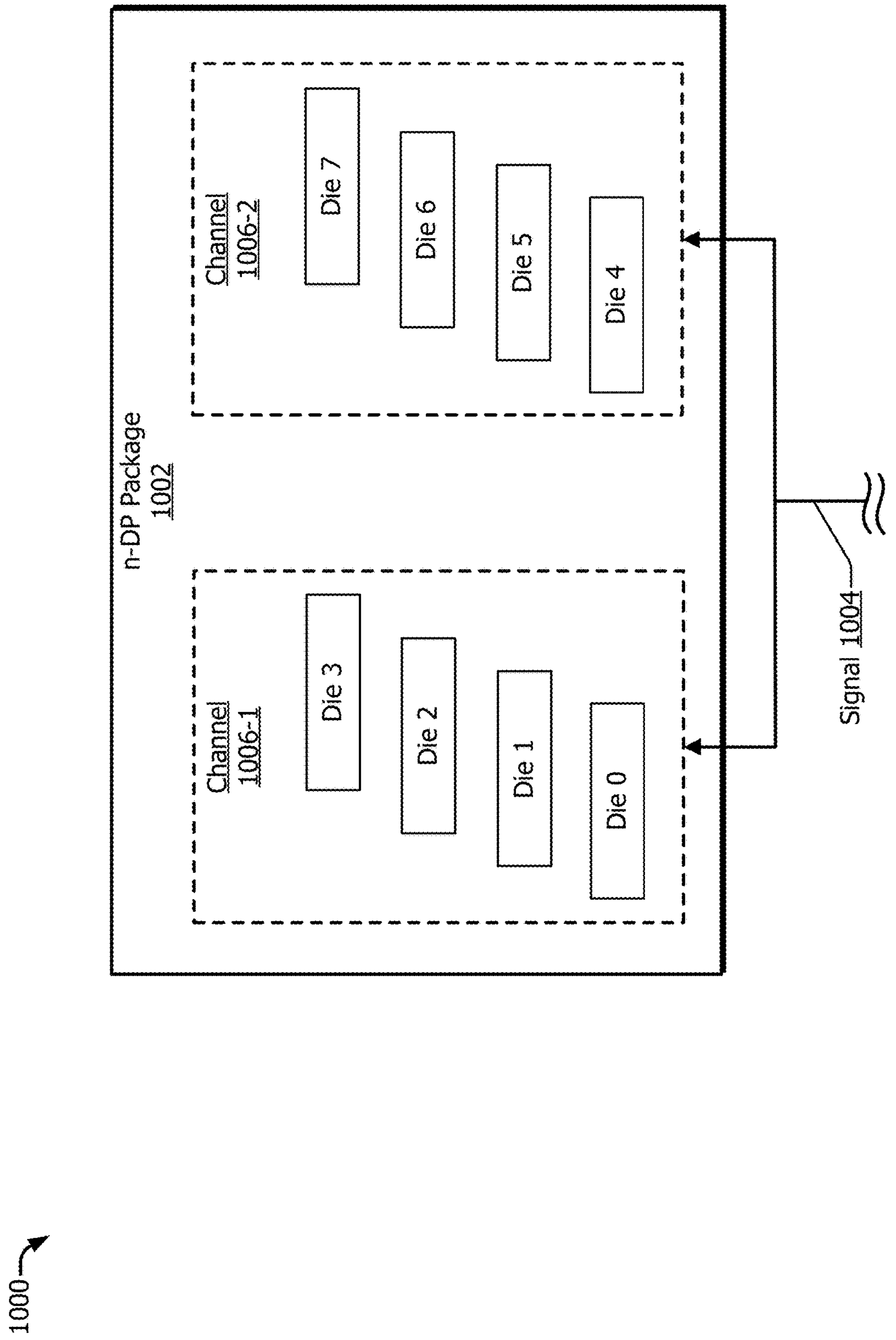
FIG. 10 illustrates a portion of another example memory system that can implement aspects of the example process of FIG. 9.

Consider FIG. 10, which illustrates a portion of another example memory system 1000 that can implement aspects of the example process of FIG. 9. The example memory system 1000 includes a multi-die package 1002, in which the multiple memory arrays of the memory device can be divided into multiple memory channels. For this example, assume there are two memory channels that are configured for synchronized or "lock-step" operation as described above. Further, assume that aspects of adaptive refresh staggering are applied at a package level, also as described above. Thus, a signal 1004 indicative of a command to enter a lower-power refresh mode can be directed to or effective for both the memory channels 1006-1 and the memory channel 1006-2.

As shown in FIG. 10, the memory channel 1006-1 includes four dies (arrays), labeled die 0 through die 3, and the memory channel 1006-2 also includes four dies (arrays), labeled die 4 through die 7. In response to receiving the signal 1004 at logic associated with die 0 of the channel 1006-1 (e.g., the logic 204, the logic 432, the logic 512, or the logic 612), die 0 can initiate refresh operations (e.g., after a time delay of approximately zero). The other dies of the package 1002 (e.g., die 1 through die 7) can then initiate refresh operations after corresponding time delays according to various patterns, as described above.

For example, in some implementations, sequential refresh operations for the dies 0-7 can proceed in a pattern in which refresh operations for each of the respective arrays/dies of the channel 1006-1 are complete before refresh operations for the dies of the other channel 1006-2 are initiated. Accordingly, after initiation of refresh operations for die 0 (the first die), initiation of refresh operations proceeds (after appropriate time delays) in a pattern such as the following: die 1, die 2, die 3, die 4, die 5, die 6, and then die 7. In other implementations, sequential refresh operations for dies 0-7 can proceed, after initiation of refresh operations for die 0, in a pattern that alternates between arrays of the multiple memory channels. For example, after the initiation of refresh operations for die 0, the initiation of refresh operations proceeds (after appropriate time delays) in an alternating pattern such as the following: die 4, die 1, die 5, die 2, die 6, die 3, and then die 7.

Staggering the start of refresh operations for each array/die, as described, can reduce peak current draw and/or power consumption relative to those associated with not staggering the start of the operations, because simultaneous, or nearly simultaneous, initiation of refresh operations for multiple dies by a particular signal or command can cause a spike in power consumption. Staggering the start of refresh operations, however, can reduce peak current draw and/or power consumption. The staggering may also introduce a time penalty, such as an increase in refresh cycle time, and there may therefore be a tradeoff between the reduction in peak power consumption and a possible increase in latency.

For the flow chart(s) and flow diagram(s) described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses, components, or other aspects shown in FIGS. 1 to 6, the components or aspects of which may be further divided, combined, rearranged, and so on. The devices and components of these figures generally represent hardware, such as electronic devices, packaged modules, IC chips, or circuits; firmware or the actions thereof, software; or a combination thereof. Thus, these figures illustrate some of the many possible systems or apparatuses capable of implementing the described methods.

Several example implementations of adaptive refresh staggering are described below.

Example 1: A method, comprising: receiving, at logic coupled to a memory device that includes multiple memory arrays divided into multiple memory channels, a signal indicative of a command to enter a lower-power refresh mode; initiating refresh operations for a first memory array of the multiple memory arrays, in response to receiving the signal; and initiating refresh operations for a second memory array of the multiple memory arrays, after a time delay.

Example 2: The method of example 1, or any other example, wherein the signal indicative of the command to enter the lower-power refresh mode is directed to a first memory channel of the multiple memory channels; and the first memory array and the second memory array are included in the first memory channel.

Example 3: The method of example 2, or any other example, further comprising: receiving, at the logic coupled to the memory device, another signal indicative of another command to enter the lower-power mode, the other signal directed to a second memory channel of the multiple memory channels; initiating refresh operations for a third memory array of the multiple memory arrays; and initiating refresh operations for a fourth memory array of the multiple memory arrays after the time delay, the third memory array and the fourth memory array included in the second memory channel.

Example 4: The method of example 1, or any other example, wherein the respective memory arrays of the multiple memory arrays comprise respective memory dies of the memory device.

Example 5: The method of example 4, or any other example, wherein a duration of the time delay is determined via a fuse-based identification of the respective memory dies.

Example 6: The method of example 4, or any other example, wherein a duration of the time delay is determined based on a ZQ identification of the respective memory dies.

Example 7: The method of example 1, or any other example, wherein the lower-power refresh mode comprises a self-refresh mode.

Example 8: The method of example 1, or any other example, wherein the memory device comports with at least one low-power double data rate (LPDDR) memory standard.

Example 9: The method of example 1, or any other example, wherein the logic and the memory device are included in a device that operates in compliance with at least one Compute Express Link (CXL) standard.

Example 10: The method of example 1, or any other example, wherein the time delay is approximately: 30 nanoseconds (ns), 100 ns, 150 ns, 200 ns, or 300 ns.

Example 11: The method of example 1, or any other example, further comprising: initiating refresh operations for a third array of the multiple arrays after another time delay.

Example 12: The method of example 11, or any other example, wherein the time delay and the other time delay are approximately a same duration.

Example 13: The method of example 11, or any other example, wherein the time delay and the other time delay are different durations.

Example 14: A method, comprising: receiving, at logic coupled to a memory device that includes multiple memory arrays in a package, a signal indicative of a command to enter a lower-power refresh mode; initiating refresh operations for a first memory array of the multiple memory arrays, in response to receiving the signal; and initiating refresh operations for a second memory array of the multiple memory arrays after a time delay.

Example 15: The method of example 14, or any other example, wherein: the memory package includes multiple memory channels; and the first array and the second array are included in a first memory channel.

Example 16: The method of example 15, or any other example, further comprising initiating refresh operations for a third memory array of the multiple memory arrays after the time delay, the third memory array included in a second memory channel.

Example 17: The method of example 14, or any other example, wherein: the memory package includes multiple memory channels; the first array is included in a first memory channel; and the second array is included in a second memory channel.

Example 18: The method of example 17, or any other example, further comprising: initiating refresh operations for a third memory array of the multiple memory arrays after the time delay, the third memory array included in the first memory channel; and initiating refresh operations for a fourth memory array of the multiple memory arrays after the time delay, the fourth memory array included in the second memory channel.

Example 19: The method of example 14, or any other example, wherein the respective memory arrays of the multiple memory arrays comprise respective memory dies of the memory device.

Example 20: The method of example 19, or any other example, wherein a duration of the time delay is determined via a fuse-based identification of the respective memory dies.

Example 21: The method of example 19, or any other example, wherein a duration of the time delay is based on a ZQ identification of the respective memory dies.

Example 22: The method of example 14, or any other example, wherein the lower-power refresh mode comprises a self-refresh mode.

Example 23: The method of example 14, or any other example, wherein the time delay is approximately: 30 nanoseconds (ns), 100 ns, 150 ns, 200 ns, or 300 ns.

Example 24: The method of example 14, or any other example, further comprising initiating refresh operations for a third array of the multiple arrays after another time delay.

Example 25: The method of example 24, or any other example, wherein the time delay and the other time delay are approximately a same duration.

Example 26: The method of example 24, wherein the time delay and the other time delay are different durations.

Example 27: The method of example 14, or any other example, wherein the memory device comports with at least one low-power double data rate (LPDDR) memory standard.

Example 28: The method of example 14, or any other example, wherein the logic and the memory device are included in a device that operates in compliance with at least one Compute Express Link (CXL) standard.

Example 29: An apparatus comprising: multiple memory arrays, divided into multiple memory channels, each memory array associated with respective logic circuitry that is configured to: receive a signal indicative of a command to enter a lower-power refresh mode; determine a duration of a respective time delay, for the associated array, related to the lower-power refresh mode; and initiate refresh operations after the time delay, responsive to receiving the signal.

Example 30: The apparatus of example 29, or any other example, wherein: the apparatus further comprises a programmable component; and each respective logic circuitry is further configured to access the programmable component to determine the duration of the respective time delay.

Example 31: The apparatus of example 30, or any other example, wherein the respective memory arrays of the multiple memory arrays comprise respective memory dies of the apparatus.

Example 32: The apparatus of example 31, or any other example, wherein the durations of the respective time delays are determined via a fuse-based identification of the respective memory dies.

Example 33: The apparatus of example 31, or any other example, wherein the durations of the respective time delays are determined based on a ZQ identification of the respective memory dies.

Example 34: The apparatus of example 29, or any other example, wherein: a respective logic circuit of a first array of the multiple arrays, the first array included in a first channel, initiates refresh operations when the signal indicative of the command to enter the lower-power mode is received, after a determination that the duration of the respective time delay for the first array is approximately zero; and respective logic circuits of other arrays of the multiple memory arrays, the other arrays included in the first channel, initiate refresh operations sequentially, subsequent to initiation of refresh operations by the first array and after the determined durations of the respective time delays.

Example 35: The apparatus of example 34, or any other example, wherein: the durations of the respective time delays for the other arrays included in the first channel are approximately a same duration; or the durations of the respective time delays for the other arrays included in the first channel are different durations.

Example 36: The apparatus of example 34, or any other example, wherein the durations of the respective time delays for the other arrays of the first channel are approximately: 30 nanoseconds (ns), 100 ns, 150 ns, 200 ns, or 300 ns.

Example 37: The apparatus of example 29, or any other example, wherein the lower-power refresh mode comprises a self-refresh mode.

Example 38 The apparatus of example 29, or any other example, wherein the multiple memory arrays comprise at least a portion of a memory package.

Example 39: The apparatus of example 29, or any other example, wherein: the multiple memory arrays are divided into at least two memory channels; a first channel includes at least a first memory array and a second memory array of the multiple memory arrays; and a second channel includes at least a third memory array and a fourth memory array of the multiple memory arrays.

Example 40: The apparatus of example 39, or any other example, wherein: the signal indicative of the command to enter the lower-power mode is directed to the first memory channel; logic associated with the first array of the first memory channel determines a first duration of a first time delay and initiates refresh operations when the first duration ends; and other logic associated with the second array of the first memory channel determines a second duration of a second time delay and initiates refresh operations when the second duration ends.

Example 41: The apparatus of example 40, or any other example, wherein: the first duration is approximately zero; and the second duration is greater than zero.

Example 42: The apparatus of example 40, or any other example, wherein: the first duration is approximately zero; and the second duration is approximately 30 nanoseconds (ns), 100 ns, 150 ns, 200 ns, or 300 ns.

Example 43: The apparatus of example 39, or any other example, wherein: the signal indicative of the command to enter the lower-power mode is directed to the second memory channel; logic associated with the third array of the second memory channel determines a third duration of a third time delay and initiates refresh operations when the third duration ends; and other logic associated with the fourth array of the second memory channel determines a fourth duration of a fourth time delay and initiates refresh operations when the fourth duration ends.

Example 44: The apparatus of example 43, or any other example, wherein: the third duration is approximately zero; and the fourth duration is greater than zero.

Example 45: The apparatus of example 43, or any other example, wherein: the third duration is approximately zero; and the fourth duration is approximately 30 nanoseconds (ns), 100 ns, 150 ns, 200 ns, or 300 ns.

Example 46: The apparatus of example 29, or any other example, wherein the multiple memory arrays comport with at least one low-power double data rate (LPDDR) memory standard.

Example 47: The apparatus of example 29, or any other example, further comprising: an interface configured to couple to a host device via an interconnect; and a link controller configured to be coupled to the interface, the link controller configured to communicate with the host device.

Example 48: The apparatus of example 47, or any other example, wherein: the interconnect is configured to comport with at least one Compute Express Link (CXL) standard; and the link controller comprises a CXL link controller.

Example 49: The apparatus of example 47, or any other example, wherein the apparatus comprises a Compute Express Link (CXL) device.

Example 50: An apparatus comprising: a memory device, including multiple memory arrays in a package, each memory array associated with respective logic circuitry configured to: receive a signal indicative of a command to enter a lower-power refresh mode; determine a duration of a respective time delay, for the associated array, related to the lower-power refresh mode; and initiate refresh operations after the time delay, responsive to receiving the signal.

Example 51: The apparatus of example 50, or any other example, wherein: the apparatus further comprises a programmable component; and each respective logic circuitry is further configured to access the programmable component to determine the duration of the respective time delay.

Example 52: The apparatus of example 51, or any other example, wherein the respective memory arrays of the multiple memory arrays comprise respective memory dies of the package.

Example 53: The apparatus of example 52, or any other example, wherein the durations of the respective time delays are determined via a fuse-based identification of the respective memory dies.

Example 54: The apparatus of example 52, or any other example, wherein the durations of the respective time delays are determined based on a ZQ identification of the respective memory dies.

Example 55: The apparatus of example 50, or any other example, wherein: a respective logic circuit of a first array of the multiple arrays initiates refresh operations when the signal indicative of the command to enter the lower-power refresh mode is received, after a determination that the duration of the respective time delay for the first array is approximately zero; and respective logic circuits of other arrays of the multiple memory arrays initiate refresh operations sequentially, subsequent to initiation of refresh operations by the first array and after the determined durations of the respective time delays.

Example 56: The apparatus of example 55, or any other example, wherein: the durations of the respective time delays for the other arrays of the multiple arrays are approximately a same duration; or the durations of the respective time delays for the other arrays of the multiple arrays are different durations.

Example 57: The apparatus of example 55, or any other example, wherein the durations of the respective time delays for the other arrays of the multiple arrays are approximately: 30 nanoseconds (ns), 100 ns, 150 ns, 200 ns, or 300 ns.

Example 58: The apparatus of example 50, or any other example, wherein the lower-power refresh mode comprises a self-refresh mode.

Example 59: The apparatus of example 50, or any other example, wherein: the package includes multiple memory channels; and each respective memory channel of the multiple memory channels includes at least one of the multiple memory arrays.

Example 60: The apparatus of example 50, or any other example, wherein: the package includes multiple memory channels, each respective memory channel of the multiple memory channels including at least one memory array of the multiple memory arrays; a first array of the multiple arrays initiates refresh operations when the signal indicative of the command to enter the lower-power refresh mode is received, after a determination that the duration of the respective time delay for the first array is approximately zero; and other arrays of the multiple memory arrays initiate refresh operations sequentially, subsequent to initiation of refresh operations by the first array and after the determined durations of the respective time delays, and in a pattern: that alternates between the arrays of the multiple memory channels; or in which refresh operations for each respective array of the respective channel of the first array are complete before refresh operations for respective arrays of a next respective channel are initiated.

Example 61: The apparatus of example 50, or any other example, wherein the multiple memory arrays comport with at least one low-power double data rate (LPDDR) memory standard.

Example 62: The apparatus of example 50, or any other example, further comprising: an interface configured to couple to a host device via an interconnect; and a link controller configured to be coupled to the interface, the link controller configured to communicate with the host device.

Example 63: The apparatus of example 62, or any other example, wherein: the interconnect is configured to comport with at least one Compute Express Link (CXL) standard; and the link controller comprises a CXL link controller.

Example 64: The apparatus of example 62, or any other example, wherein the apparatus comprises a Compute Express Link (CXL) device.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for adaptive refresh staggering have been described in language specific to certain features and/or methods, the subject of the appended claims is not necessarily limited to the specific features or methods described. Rather, the specific features and methods are disclosed as example implementations for response-based interconnect control.

What is claimed is:

1. A method, comprising:

receiving, at logic of a memory device that includes multiple memory dies divided into multiple memory channels, and at least partly on a per-channel basis for logic circuitry of the logic, a signal indicative of a command to enter a lower-power refresh mode, the signal indicative of the command to enter the lower-power refresh mode directed to a first memory channel of the multiple memory channels, each memory die of the multiple memory dies respectively including the logic circuitry, the logic circuitry including first logic circuitry and second logic circuitry;

determining, by the first logic circuitry of a first memory die of the multiple memory dies, and at least partly on a per-channel basis for the first logic circuitry, a duration of a first time delay in relation to the lower-power refresh mode;

initiating, by the first logic circuitry of the first memory die of the multiple memory dies, refresh operations for the first memory die after the first time delay in response to receiving the signal, the first memory die included in the first memory channel;

determining, by the second logic circuitry of a second memory die of the multiple memory dies, and at least partly on a per-channel basis for the second logic circuitry, a duration of a second time delay in relation to the lower-power refresh mode; and initiating, by the second logic circuitry of the second memory die of the multiple memory dies, refresh operations for the second memory die after the second time delay in response to receiving the signal, the second memory die included in the first memory channel.

2. The method of claim 1, further comprising:

receiving, at the logic of the memory device and at least partly on a per-channel basis, another signal indicative of another command to enter the lower-power refresh mode, the other signal indicative of the other command to enter the lower-power refresh mode directed to a second memory channel of the multiple memory channels, the logic circuitry including third logic circuitry and fourth logic circuitry;

determining, by the third logic circuitry of a third memory die of the multiple memory dies, and at least partly on a per-channel basis for the third logic circuitry, a duration of a third time delay in relation to the lower-power refresh mode;

initiating, by the third logic circuitry of the third memory die of the multiple memory dies, refresh operations for the third memory die after the third time delay in response to receiving the other signal, the third memory die included in the second memory channel;

determining, by the fourth logic circuitry of a fourth memory die of the multiple memory dies, and at least partly on a per-channel basis for the fourth logic circuitry, a duration of a fourth time delay in relation to the lower-power refresh mode; and initiating, by the fourth logic circuitry of the fourth memory die of the multiple memory dies, refresh operations for the fourth memory die after the fourth time delay in response to receiving the other signal, the fourth memory die included in the second memory channel.

3. The method of claim 1, wherein:

respective memory dies of the multiple memory dies comprise respective memory arrays of the memory device, and the method further comprises:

determining the duration of the first time delay or the duration of the second time delay via:

a fuse-based identification of the respective memory dies; or an impedance-based identification of the respective memory dies.

4. The method of claim 1, wherein the logic and the memory device are included in a device that operates in compliance with at least one Compute Express Link (CXL) standard.

5. A method, comprising:

receiving, at logic of a memory device that includes multiple memory dies in a memory package, and at least partly on a per-channel basis for logic circuitry of the logic, a signal indicative of a command to enter a lower-power refresh mode, each memory die of the multiple memory dies respectively including the logic circuitry, the multiple memory dies including a first memory die and a second memory die, the memory package including multiple memory channels, the first memory die and the second memory die included in a first memory channel of the multiple memory channels, the logic circuitry including first logic circuitry of the first memory die and second logic circuitry of the second memory die;

determining, by the first logic circuitry, and at least partly on a per-channel basis for the first logic circuitry, a duration of a first time delay in relation to the lower-power refresh mode based on at least one programmable component;

initiating, by the first logic circuitry, refresh operations for the first memory die of the multiple memory dies based on the first time delay and in response to receiving the signal;

determining, by the second logic circuitry, and at least partly on a per-channel basis for the second logic circuitry, a duration of a second time delay in relation to the lower-power refresh mode based on the at least one programmable component; and initiating, by the second logic circuitry, refresh operations for the second memory die of the multiple memory dies based on the second time delay and in response to receiving the signal.

6. The method of claim 5, further comprising:

determining, by third logic circuitry of a third memory die of the multiple memory dies, and at least partly on a per-channel basis for the third logic circuitry, a duration of a third time delay in relation to the lower-power refresh mode based on the at least one programmable component; and initiating, by the third logic circuitry, refresh operations for the third memory die of the multiple memory dies based on the third time delay, the third memory die included in a second memory channel of the multiple memory channels.

7. The method of claim 5, further comprising:

determining, by third logic circuitry of a third memory die of the multiple memory dies, and at least partly on a per-channel basis for the third logic circuitry, a duration of a third time delay in relation to the lower-power refresh mode based on the at least one programmable component;

initiating, by the third logic circuitry, refresh operations for the third memory die of the multiple memory dies based on the third time delay, the third memory die included in a second memory channel of the multiple memory channels;

determining, by fourth logic circuitry of a fourth memory die of the multiple memory dies, and at least partly on a per-channel basis for the fourth logic circuitry, a duration of a fourth time delay in relation to the lower-power refresh mode based on the at least one programmable component; and initiating, by the fourth logic circuitry, refresh operations for the fourth memory die of the multiple memory dies based on the fourth time delay, the fourth memory die included in the second memory channel.

8. The method of claim 5, wherein:

respective memory dies of the multiple memory dies comprise respective memory arrays of the memory device, and the method further comprises:

determining the duration of the first time delay or the duration of the second time delay via:

a fuse-based identification of the respective memory dies; or an impedance-based identification of the respective memory dies.

9. The method of claim 5, wherein the logic and the memory device are included in a device that operates in compliance with at least one Compute Express Link (CXL) standard.

10. An apparatus comprising:
multiple memory dies divided into multiple memory channels, each respective memory die including respective logic circuitry that is configured to:
receive, at least partly on a per-channel basis for the respective logic circuitry, a signal indicative of a command to enter a lower-power refresh mode;
determine, at least partly on a per-channel basis for the respective logic circuitry, a duration of a respective time delay for the respective memory die in relation to the lower-power refresh mode based on at least one programmable component; and
initiate refresh operations after the respective time delay responsive to receipt of the signal indicative of the command to enter the lower-power refresh mode.

11. The apparatus of claim 10, wherein:
the apparatus further comprises multiple programmable components including the at least one programmable component; and
each respective logic circuitry is further configured to access a respective programmable component of the multiple programmable components to determine the duration of the respective time delay for the respective memory die.

12. The apparatus of claim 10, wherein:
respective memory dies of the multiple memory dies comprise respective memory arrays of the apparatus; and
each respective logic circuitry is configured to determine the duration of the respective time delay for the respective memory die via:
a fuse-based identification of the respective memory die; or
an impedance-based identification of the respective memory die.

13. An apparatus comprising:
multiple memory arrays divided into multiple memory channels, each memory array associated with respective logic circuitry that is configured to:
receive a signal indicative of a command to enter a lower-power refresh mode;
determine a duration of a respective time delay for an associated array in relation to the lower-power refresh mode; and
initiate refresh operations after the respective time delay responsive to receiving the signal, wherein:
the multiple memory arrays are divided into at least two memory channels;
a first memory channel includes at least a first memory array and a second memory array of the multiple memory arrays;
a second memory channel includes at least a third memory array and a fourth memory array of the multiple memory arrays; and
(A) the signal indicative of the command to enter the lower-power refresh mode is directed to the first memory channel;
logic associated with the first memory array of the first memory channel is configured to determine a first duration of a first time delay and initiate refresh operations responsive to an end of the first duration; and
other logic associated with the second memory array of the first memory channel is configured to determine a second duration of a second time delay and initiate refresh operations responsive to an end of the second duration; or
(B) the signal indicative of the command to enter the lower-power refresh mode is directed to the second memory channel;
logic associated with the third memory array of the second memory channel is configured to determine a third duration of a third time delay and initiate refresh operations responsive to an end of the third duration; and
other logic associated with the fourth memory array of the second memory channel is configured to determine a fourth duration of a fourth time delay and initiate refresh operations responsive to an end of the fourth duration.

14. The apparatus of claim 10, wherein:
the multiple memory dies comprise at least a portion of a memory package.

15. The apparatus of claim 14, wherein:
the memory package includes the multiple memory channels; and
each respective memory channel of the multiple memory channels includes at least one memory die of the multiple memory dies.

16. The apparatus of claim 14, wherein:
the memory package includes the multiple memory channels, each respective memory channel of the multiple memory channels including at least one memory die of the multiple memory dies;
respective logic circuitry of a first memory die of the multiple memory dies is configured to initiate refresh operations responsive to receipt of the signal indicative of the command to enter the lower-power refresh mode after a determination that the duration of the respective time delay for the first memory die is approximately zero; and
other respective logic circuitry of other memory dies of the multiple memory dies are configured to initiate other refresh operations sequentially, subsequent to initiation of the refresh operations by the respective logic circuitry of the first memory die and after determinations of other durations of other respective time delays, and in a pattern:
that alternates with respect to the memory dies across the multiple memory channels; or
in which refresh operations for each respective memory die of a respective memory channel of the multiple memory channels are completed before refresh operations for respective memory dies of a next respective memory channel of the multiple memory channels are initiated.

17. The apparatus of claim 10, wherein the multiple memory dies comport with at least one low-power double data rate (LPDDR) memory standard.

18. The apparatus of claim 10, further comprising:
an interface configured to couple to a host device via an interconnect; and
a link controller configured to be coupled to the interface, the link controller configured to communicate with the host device via the interface.

19. The apparatus of claim 18, wherein:
the interconnect is configured to comport with at least one Compute Express Link (CXL) standard; and the link controller is coupled to the interface and comprises a CXL link controller.

20. The apparatus of claim 18, wherein the apparatus comprises a Compute Express Link (CXL) device.

* * * * *